US012575112B2

(12) United States Patent
Ling et al.

(10) Patent No.: US 12,575,112 B2
(45) Date of Patent: Mar. 10, 2026

(54) NON-VOLATILE MEMORY DEVICE HAVING PN DIODE

(71) Applicant: Peiching Ling, San Jose, CA (US)

(72) Inventors: Peiching Ling, San Jose, CA (US); Nanray Wu, Fremont, CA (US)

(73) Assignee: Peiching Ling, San Jose, CA (US)

( * ) Notice: Subject to any disclaimer, the term of this patent is extended or adjusted under 35 U.S.C. 154(b) by 691 days.

(21) Appl. No.: 17/578,448

(22) Filed: Jan. 19, 2022

(65) Prior Publication Data
US 2022/0231083 A1 Jul. 21, 2022

(30) Foreign Application Priority Data
Jan. 21, 2021 (TW) ................................. 110102241

(51) Int. Cl.
H10B 61/00 (2023.01)

(52) U.S. Cl.
CPC .................................... H10B 61/10 (2023.02)

(58) Field of Classification Search
CPC .... H10B 61/10; H10B 63/20; G11C 11/1659; G11C 2213/72; G11C 13/003; H10N 50/01; H10N 50/10; H10N 70/011; H10N 70/231; H10N 70/24
See application file for complete search history.

(56) References Cited

U.S. PATENT DOCUMENTS 4,322,821 A 3/1982 Lohstroh et al.
7,180,160 B2 * 2/2007 Ferrant .................. H10B 61/10
257/E27.005

7,466,586 B2 12/2008 Kim
9,858,975 B1 * 1/2018 Hatcher ................ G11C 11/161
9,923,027 B2 3/2018 Chiu et al.
10,325,926 B2 6/2019 Tang et al.
2005/0254283 A1 11/2005 Kang
2007/0133263 A1 6/2007 Haratani
2007/0223150 A1 9/2007 Fukuzawa et al.
2007/0297101 A1 12/2007 Inomata et al.
(Continued)

FOREIGN PATENT DOCUMENTS

CN 1505042 A 6/2004
CN 111724837 A 9/2020
KR 101147481 B1 5/2012

OTHER PUBLICATIONS

International Search Report and Written Opinion mailed on Apr. 18, 2022 in International Patent Application No. PCT/US2022/012838, filed on Jan. 18, 2022.

*Primary Examiner* — William B Partridge
*Assistant Examiner* — Linda J. Fleck
(74) *Attorney, Agent, or Firm* — Huan-Yi Lin

(57) ABSTRACT

A non-volatile memory device includes: an insulation layer; a PN diode, which is formed in a monocrystalline silicon layer, a monocrystalline germanium layer or a monocrystalline gallium arsenide layer on the insulation layer; a writing wire which is conductive and is electrically connected to the anode end of the PN diode; a memory unit on the PN diode, the memory unit being electrically connected to a cathode end of the PN diode; and a selection wire on the memory unit, the selection wire being electrically connected to the memory unit; wherein when the non-volatile memory device is selected for a data to be written into, a first current flows through the PN diode to write the data into the memory unit.

19 Claims, 25 Drawing Sheets

(56)          References Cited

U.S. PATENT DOCUMENTS

| | | | | |
|---|---|---|---|---|
| 2008/0157126 | A1 | 7/2008 | Bertin et al. | |
| 2009/0316467 | A1* | 12/2009 | Liu | H01L 29/872 |
| | | | | 438/667 |
| 2010/0044670 | A1 | 2/2010 | Ling | |
| 2010/0118602 | A1* | 5/2010 | Carter | G11C 11/1673 |
| | | | | 365/171 |
| 2010/0219392 | A1 | 9/2010 | Awaya et al. | |
| 2011/0122149 | A1* | 5/2011 | Souchard | G06T 5/80 |
| | | | | 345/611 |
| 2011/0133149 | A1 | 6/2011 | Sonehara | |
| 2011/0215436 | A1 | 9/2011 | Tang et al. | |
| 2012/0051137 | A1 | 3/2012 | Hung et al. | |
| 2012/0182801 | A1 | 7/2012 | Lue | |
| 2012/0327714 | A1* | 12/2012 | Lue | H10B 43/20 |
| | | | | 365/185.17 |
| 2013/0270626 | A1* | 10/2013 | Lue | H10D 30/69 |
| | | | | 257/324 |
| 2014/0160830 | A1* | 6/2014 | Chung | G11C 17/18 |
| | | | | 365/96 |
| 2015/0123192 | A1* | 5/2015 | Hung | G11C 16/10 |
| | | | | 438/618 |
| 2015/0162080 | A1 | 6/2015 | Song | |
| 2018/0006086 | A1* | 1/2018 | Chiu | H10B 63/20 |
| 2020/0135251 | A1* | 4/2020 | Osborne | G11C 13/004 |
| 2021/0408120 | A1* | 12/2021 | Lin | H10B 63/20 |
| 2022/0328560 | A1* | 10/2022 | Lai | G11C 13/0033 |
| 2023/0260570 | A1* | 8/2023 | Lin | G11C 11/418 |
| | | | | 365/154 |
| 2024/0138155 | A1* | 4/2024 | Ling | H01L 23/528 |

* cited by examiner

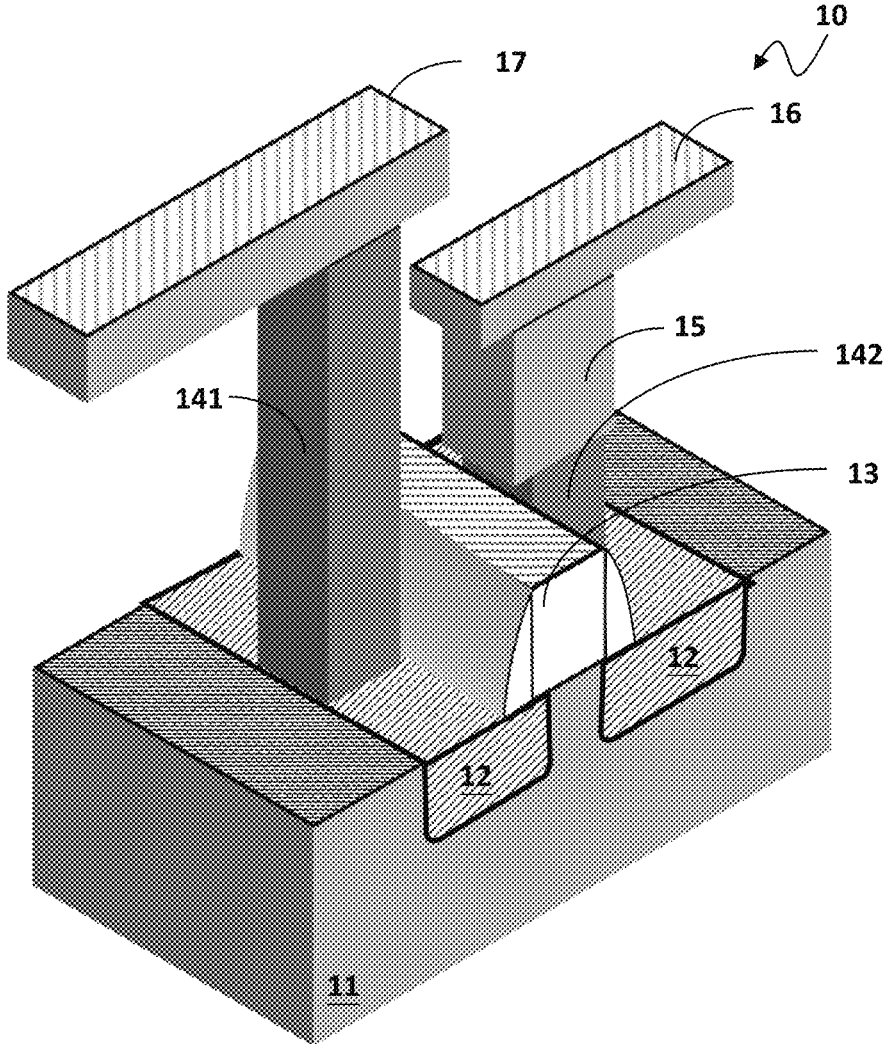
Fig. 1B   (Prior Art)

Control Circuit
410

| | 841 | 842 | 86 | 841 & 842 of Unselected Non-Volatile Memory Device | 86 of Unselected Non-Volatile Memory Device |
|---|---|---|---|---|---|
| Write "0" | Vw | Floating | 0 | Floating | Floating |
| Write "1" | Floating | 0 | Vw | Floating | Floating |
| Read | Floating | Sense | Vr | Floating | Floating |

| | 942 | 971 | 96 | 942 & 971 of Unselected Non-Volatile Memory Device | 96 of Unselected Non-Volatile Memory Device |
|---|---|---|---|---|---|
| Write "0" | Vw | Floating | 0 | Floating | Floating |
| Write "1" | Floating | 0 | Vw | Floating | Floating |
| Read | Floating | Sense | Vr | Floating | Floating |

| | 106 | 1073 | 1072 | 1042 | 1041 | Writing Wire of Unselected Non-Volatile Memory Device | 106 of Unselected Non-Volatile Memory Device |
|---|---|---|---|---|---|---|---|
| Write "0" | Floating | Floating | 0 | Floating | Vw | Floating | Floating |
| Write "1" | Floating | 0 | Floating | Vw | Floating | Floating | Floating |
| Read | Vr | Floating | Floating | Sense | Floating | Floating | Floating |

Fig. 11B

NON-VOLATILE MEMORY DEVICE HAVING PN DIODE

CROSS REFERENCE

The present invention claims priority to TW 110102241 filed on Jan. 21, 2021.

BACKGROUND OF THE INVENTION

Field of Invention

The present invention relates to a non-volatile memory device; particularly, it relates to such non-volatile memory device having a PN diode.

Description of Related Art

Please refer to FIG. 1A and FIG. 1B, which show a cross-sectional diagram and a three-dimensional diagram of a conventional phase change random access memory (PCRAM) device 10, respectively. The PCRAM device 10 is a type of non-volatile memory device and can be applied in an electronic circuit to store data. When the electronic circuit is turned OFF and there is no power, the data can still be kept in a phase change area of the PCRAM device 10 without lost.

As shown in FIG. 1A and FIG. 1B, the PCRAM device 10 is formed on a substrate 11. The PCRAM device 10 includes: a source/drain 12, a bi-directional selector 13, metal plugs 141 and 142, a phase change area 15, a ground wire 16 and a bit wire 17. An addressing operation by the bi-directional selector 13 and the bit wire 17 determines a specific address of the phase change area 15 of the PCRAM device 10, so as to write data into the address. To be more specific, a channel between the source/drain 12 can be conducted through controlling the bi-directional selector 13, whereby a current is controlled to flow from the metal plug 141, through the source/drain 12, the above-mentioned channel between the source/drain 12, the metal plug 142 and the phase change area 15, to ground wire 16; this current is controlled by controlling a voltage of the bit wire 17, so as to change a crystallization status of the material in the phase change area 15. Different crystallization statuses result in different resistances of the phase change area 15, which can be used to indicate different stored data. The material in the phase change area 15 for example can be a GeSbTe (GST) alloy; the GST alloy has different resistances in its crystallization status and amorphous status. The PCRAM device 10 can write a data indicative of "1" or "0" into the phase change area 15 through the above-mentioned addressing operation and resistance-changing operation, which is well known to those skilled in the art, so the details thereof are not redundantly explained here.

Please refer to FIG. 2A and FIG. 2B, which show a cross-sectional diagram and a three-dimensional diagram of a conventional spin transfer torque (STT) type magnetoresistive random access memory (MRAM) device 20, respectively. The STT type MRAM (abbreviated as "STT-MRAM") device 20 is a type of MRAM device and is also a type of non-volatile memory device, which can be applied in an electronic circuit to store data. When the electronic circuit is turned OFF and there is no power, the data can still be kept in a magnetic area of the MRAM device 20 without lost. The STT-MRAM device 20 includes: a top electrode and a bottom electrode, both of which are made of ferromagnetic material; and an oxide layer (e.g., a magnesium oxide layer) interposed between the top electrode and the bottom electrode. In a case where a magnetization orientation between the top ferromagnetic layer and the bottom ferromagnetic layer (i.e., the top electrode and the bottom electrode) changes from a parallel orientation to an antiparallel orientation, the resistance of the MRAM device will become relatively larger. On the contrary, in a case where the magnetization orientation between the top ferromagnetic layer and the bottom ferromagnetic layer (i.e., the top electrode and the bottom electrode) changes from an anti-parallel orientation to a parallel orientation, the resistance of the STT-MRAM device 20 will become relatively smaller. In light of this, by different resistances of the magnetic area, the STT-MRAM device 20 can indicate different stored data.

As shown in FIG. 2A and FIG. 2B, the STT-MRAM device 20 is formed on a substrate 21. The STT-MRAM device 20 includes: a source/drain 22, a bi-directional selector 23, metal plugs 241 and 242, a magnetic area 25, connection wires 261 and 262 and a bit wire 27. An addressing operation by the bi-directional selector 23 and the bit wire 27 determines a specific address of the magnetic area 25 of the STT-MRAM device 20, so as to write data into the address. To be more specific, a channel between the source/drain 22 can be conducted through controlling the bi-directional selector 23, whereby a current is controlled to flow from the magnetic area 25, through the connection wire 261, the metal plug 241, the source/drain 22, the above-mentioned channel between the source/drain 22 and the metal plug 142, to the connection wire 262; this current is controlled by controlling a voltage of the bit wire 27, so as to change a magnetization orientation of the material in the magnetic area 25. As described above, different magnetization orientations between the top ferromagnetic layer and the bottom ferromagnetic layer can cause the magnetic area 25 to have different resistances, which can be used to indicate different stored data. The material in the magnetic area 25 for example can be a CoFe alloy or a CoFeB alloy. The STT-MRAM device 20 can write a data indicative of "1" or "0" into the magnetic area 25 through the above-mentioned mechanism, which is well known to those skilled in the art, so the details thereof are not redundantly explained here.

Please refer to FIG. 3A and FIG. 3B, which show a cross-sectional diagram and a three-dimensional diagram of a conventional resistive random access memory (RRAM) device 30, respectively. The RRAM device 30 is a type of non-volatile memory device and can be applied in an electronic circuit to store data. When the electronic circuit is turned OFF and there is no power, the data can still be kept in a resistance change area of the RRAM device 30 without lost.

As shown in FIG. 3A and FIG. 3B, the RRAM device 30 is formed on a substrate 31. The RRAM device 30 includes: a source/drain 32, a bi-directional selector 33, metal plugs 341 and 342, a resistance change area 35, a ground wire 36 and a bit wire 37. An addressing operation by the bi-directional selector 33 and the bit wire 37 determines a specific address of the resistance change area 35 of the RRAM device 30, so as to write data into the address. To be more specific, a channel between the source/drain 32 can be conducted through controlling the bi-directional selector 33, whereby a current is controlled to flow from the metal plug 341, through the source/drain 32, the above-mentioned channel between the source/drain 32, the metal plug 342, and the resistance change area 35, to ground wire 36; this current can be controlled through controlling a voltage of the bit wire 37, so as to change a resistance in the resistance change area 35, whereby the resistance change area 35 can have different resistances to indicate different stored data. The resistance change area 35 includes two metal layers and a dielectric layer which separates the two metal layers from each other. The material in the metal layers for example can be a copper telluride (CuTe) alloy or a copper germanium (CuGe) alloy. The RRAM device 30 can write a data indicative of "1" or "0" into the resistance change area 35 through the above-mentioned addressing operation and resistance-changing operation, which is well known to those skilled in the art, so the details thereof are not redundantly explained here.

In a conventional non-volatile memory device, a selector which operates for writing data into a data storage cell is a bi-directional switch, such as the above-mentioned bi-directional selectors 13, 23 and 33; the above-mentioned bi-directional selectors 13, 23 and 33 are typically made of a metal oxide semiconductor (MOS) device. This results in at least the following drawbacks: first, the MOS device is required to have a source, a gate and a drain, so the area occupied by the MOS device is larger as compared to a diode (e.g., a PN diode). As a result, the conventional non-volatile memory device is fundamentally inferior to shrink its size. Second, because the MOS device has a saturation region, its conduction current is lower as compared to a diode (e.g., a PN diode), i.e., the conduction current of the MOS device is limited by its electric characteristics. Taking an MRAM device as an example, in a case where a bi-directional selector is made of a MOS device, a current to write data into a magnetic area needs to reach a level of $10^7$ A/cm$^2$. To reach such level of $10^7$ A/cm$^2$, as compared to a PN diode, the area required for the MOS device will be tremendously larger. Lastly, a channel of the MOS device formed in a semiconductor substrate has a relatively larger leakage current. Thus, the conventional non-volatile memory device using a MOS device as a bi-directional selector is disadvantageous in shrinking size and in increasing current per unit area.

Another relevant prior art of which the inventor is aware is a 90 nm PCRAM device having 512 MB memory, disclosed by J. H. Oh et al. in "DOI No.: 10.1109/IEDM.2006346905". This prior art discloses a PCRAM device manufactured by a standard CMOS manufacturing process. The manufacturing process steps for this prior art PCRAM device include: first, an epitaxial silicon layer is formed on a silicon substrate heavily doped by N-type impurities. Second, a PN diode is formed in the epitaxial silicon layer, to serve as a selector of the prior art PCRAM device. In this prior art PCRAM device, because the PN diode is formed in the epitaxial silicon layer, its conduction resistance is higher than the conduction resistance of a case wherein the PN diode is formed in a monocrystalline silicon layer. Besides, the silicon substrate heavily doped cannot be effectively insulated from other devices, so this prior art PCRAM device will undesirably have a larger leakage current. Moreover, the size of this prior art PCRAM device is difficult to be shrunk.

In view of the above, to overcome the drawbacks in the prior art, the present invention proposes a non-volatile memory device having a PN diode, which occupies less area and provides higher current per unit area. Consequently and desirably, the application range of such non-volatile memory device is greatly broadened.

SUMMARY OF THE INVENTION

From one perspective, the present invention provides a non-volatile memory device, comprising: an insulation layer, which is electrically insulative; a first PN diode, which is formed in a monocrystalline silicon layer, a monocrystalline germanium layer or a monocrystalline gallium arsenide layer on the insulation layer; a first writing wire which is conductive, wherein the first writing wire is electrically connected to a first anode end of the first PN diode; a memory unit, which is located on the first PN diode, wherein the memory unit is electrically connected to a first cathode end of the first PN diode; and a selection wire which is conductive, wherein the selection wire is located on the memory unit and is electrically connected to the memory unit; wherein in a case where the non-volatile memory device is selected for a first data to be written into, a first current flows through the first PN diode, so as to write the first data into the memory unit.

From another perspective, the present invention provides a non-volatile memory circuit, comprising: a non-volatile memory device array including a plurality of non-volatile memory devices; and a control circuit configured to operably control the non-volatile memory device array so as to read from or write into the non-volatile memory devices; wherein the non-volatile memory device includes: an insulation layer, which is electrically insulative; a first PN diode, which is formed in a monocrystalline silicon layer, a monocrystalline germanium layer or a monocrystalline gallium arsenide layer on the insulation layer; a first writing wire which is conductive, wherein the first writing wire is electrically connected to a first anode end of the first PN diode; a memory unit, which is located on the first PN diode, wherein the memory unit is electrically connected to a first cathode end of the first PN diode; and a selection wire which is conductive, wherein the selection wire is located on the memory unit and is electrically connected to the memory unit; wherein in a case where the non-volatile memory device is selected for a first data to be written into, a first current flows through the first PN diode, so as to write the first data into the memory unit.

In one embodiment, the first PN diode is stacked and connected on the insulation layer.

In one embodiment, the first writing wire is stacked and connected on the insulation layer, and the first PN diode is stacked and connected on the first writing wire.

In one embodiment, the non-volatile memory device further comprises: a second PN diode, which is formed in the monocrystalline silicon layer, the monocrystalline germanium layer or the monocrystalline gallium arsenide layer on the insulation layer; a second writing wire which is conductive, wherein the second writing wire is electrically connected to a second cathode end of the second PN diode; wherein in a case where the non-volatile memory device is selected for a second data to be written into, a second current flows through the second PN diode, so as to write the second data into the memory unit.

In one embodiment, the second PN diode is stacked and connected on the insulation layer.

In one embodiment, the second writing wire is stacked and connected on the insulation layer, and the second PN diode is stacked and connected on the second writing wire.

In one embodiment, the non-volatile memory device further comprises: a first connection conduction unit, which is configured to electrically connect the memory unit to the first cathode end of the first PN diode, wherein a portion of the first connection conduction unit is stacked and connected on the first cathode end of the first PN diode; and a second connection conduction unit, which is configured to electrically connect the first connection conduction unit to the second anode end of the second PN diode, so that the memory unit is electrically connected to the second anode end of the second PN diode; wherein the first writing wire is stacked and connected on the insulation layer, and wherein the first anode end of the first PN diode is stacked and connected on the first writing wire, and wherein the first cathode end is stacked and connected on the first anode end; wherein a first portion of the second connection conduction unit is stacked and connected on the insulation layer, and wherein a second portion of the second connection conduction unit is stacked and connected on the first portion of the second connection conduction unit, and wherein another portion of the first connection conduction unit is stacked and connected on the second portion of the second connection conduction unit; wherein the second anode end is stacked and connected on the first portion of the second connection conduction unit, and wherein the second cathode end is stacked and connected on the second anode end, and wherein the second writing wire is stacked and connected on the second cathode end; wherein the first writing wire and the first portion of the second connection conduction unit are formed by one same metal line formation process; wherein the first anode end and the second anode end are formed by one same ion implantation process or by one same epitaxial process; wherein the first cathode end and the second cathode end are formed by one same ion implantation process or by one same epitaxial process.

In one embodiment, the non-volatile memory device further comprises: a first connection conduction unit, which is electrically connected between the first PN diode and the memory unit, wherein the first connection conduction unit is configured to electrically connect the memory unit to the first cathode end of the first PN diode.

In one embodiment, the non-volatile memory device further comprises: a second connection conduction unit, which is electrically connected between the second PN diode and the memory unit, wherein the second connection conduction unit is configured to electrically connect the memory unit to the second anode end of the second PN diode.

In one embodiment, the non-volatile memory device is a phase change random access memory (PCRAM)), a magnetoresistive random access memory (MRAM) or a resistive random access memory (RRAM).

In one embodiment, the first writing wire is a metal wire.

In one embodiment, the first writing wire and the second writing wire are both metal wires.

In one embodiment, the non-volatile memory device is formed on a semiconductor-on-insulator (SOI) substrate or a semiconductor-metal-on-insulator (SMOI) substrate.

In one embodiment, the first connection conduction unit and the second writing wire are formed by one same metal line formation process.

The objectives, technical details, features, and effects of the present invention will be better understood with regard to the detailed description of the embodiments below, with reference to the attached drawings.

BRIEF DESCRIPTION OF THE DRAWINGS

FIG. 1A and FIG. 1B show a cross-sectional diagram and a three-dimensional diagram of a conventional phase change random access memory (PCRAM) device 10, respectively.

FIG. 8A and FIG. 8B respectively show a cross-sectional diagram and a three-dimensional diagram of a non-volatile memory device according to an embodiment of the present invention, while, FIG. 8C shows an operation table corresponding to an operation of FIG. 8A and FIG. 8B.

FIG. 9A and FIG. 9B respectively show a cross-sectional diagram and a three-dimensional diagram of a non-volatile memory device according to an embodiment of the present invention, while.

FIG. 11A shows a three-dimensional diagram of a non-volatile memory device according to an embodiment of the present invention, while, FIG. 11B shows an operation table corresponding to an operation of FIG. 11A.

DESCRIPTION OF THE PREFERRED EMBODIMENTS

The drawings as referred to throughout the description of the present invention are for illustration only, to show the interrelations among the layers of the device configuration, while the shapes, thicknesses, and widths are not drawn in actual scale.

Figure 1A:
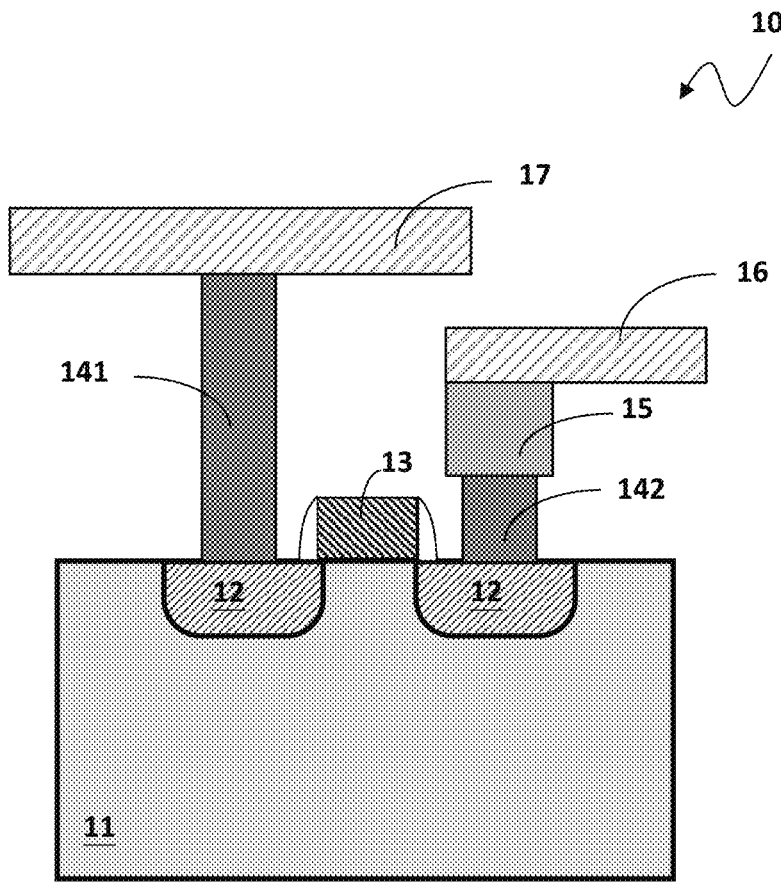
Figure 2A:
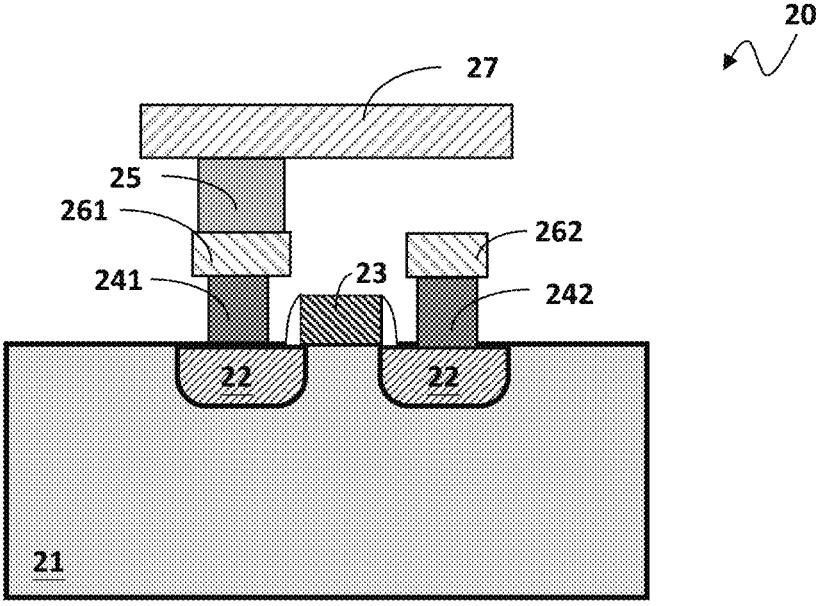
FIG. 2A and FIG. 2B show a cross-sectional diagram and a three-dimensional diagram of a conventional spin transfer torque (STT) type magnetoresistive random access memory (MRAM) device 20, respectively.
Figure 2B:
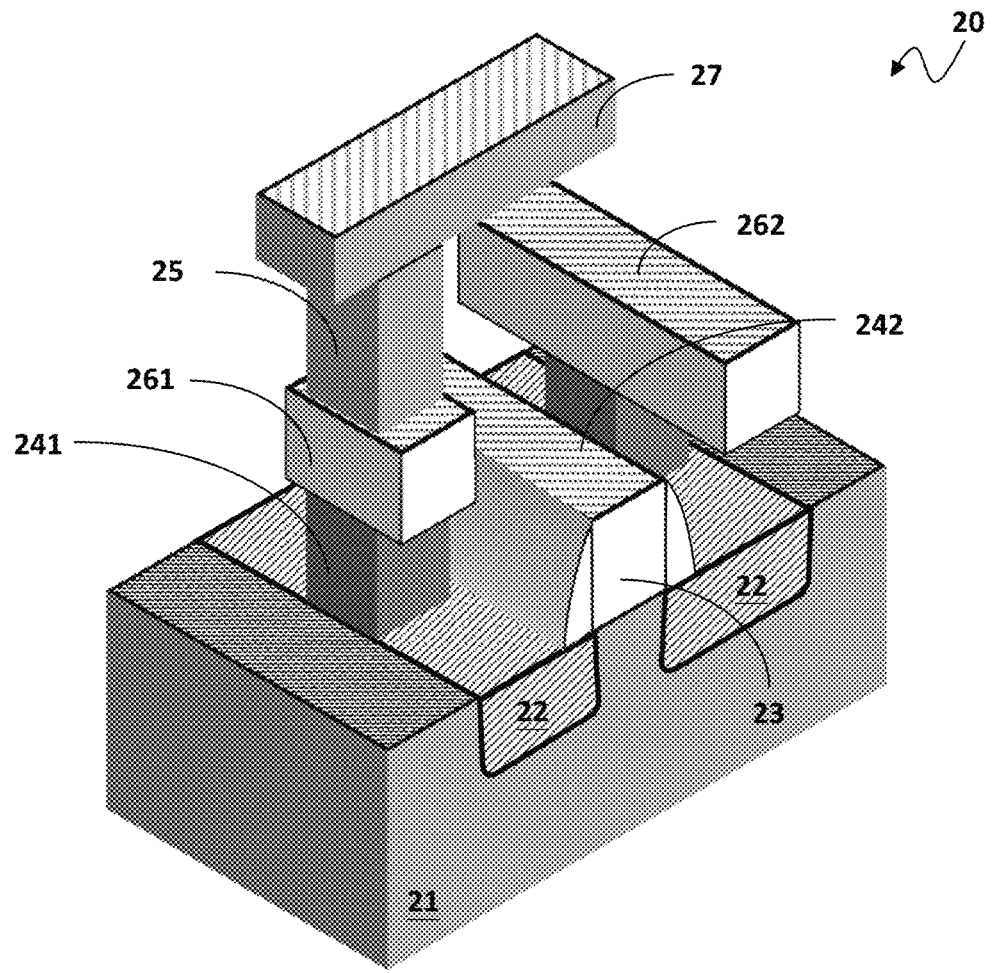
Figure 3A:
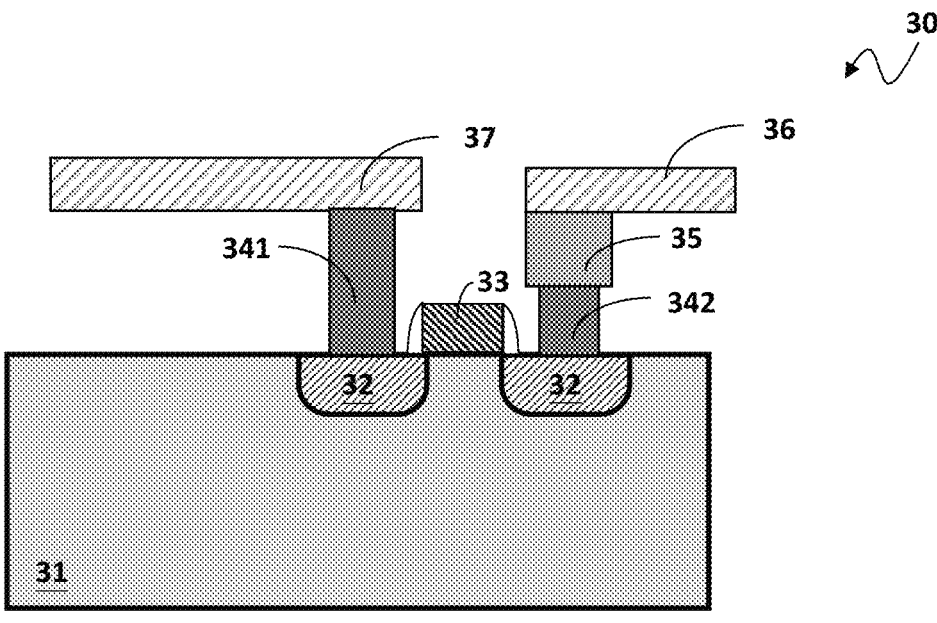
FIG. 3A and FIG. 3B show a cross-sectional diagram and a three-dimensional diagram of a conventional resistive random access memory (RRAM) device 30, respectively.
Figure 3B:
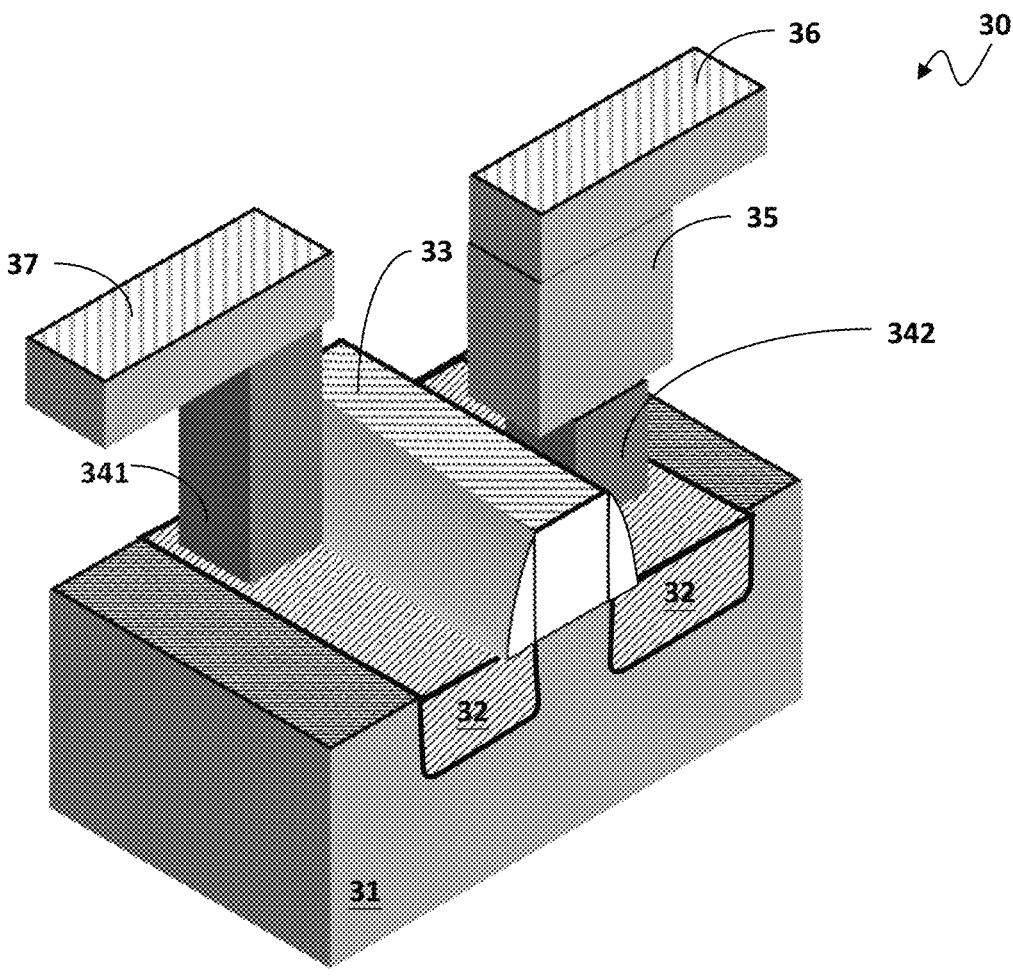
Figure 4A:
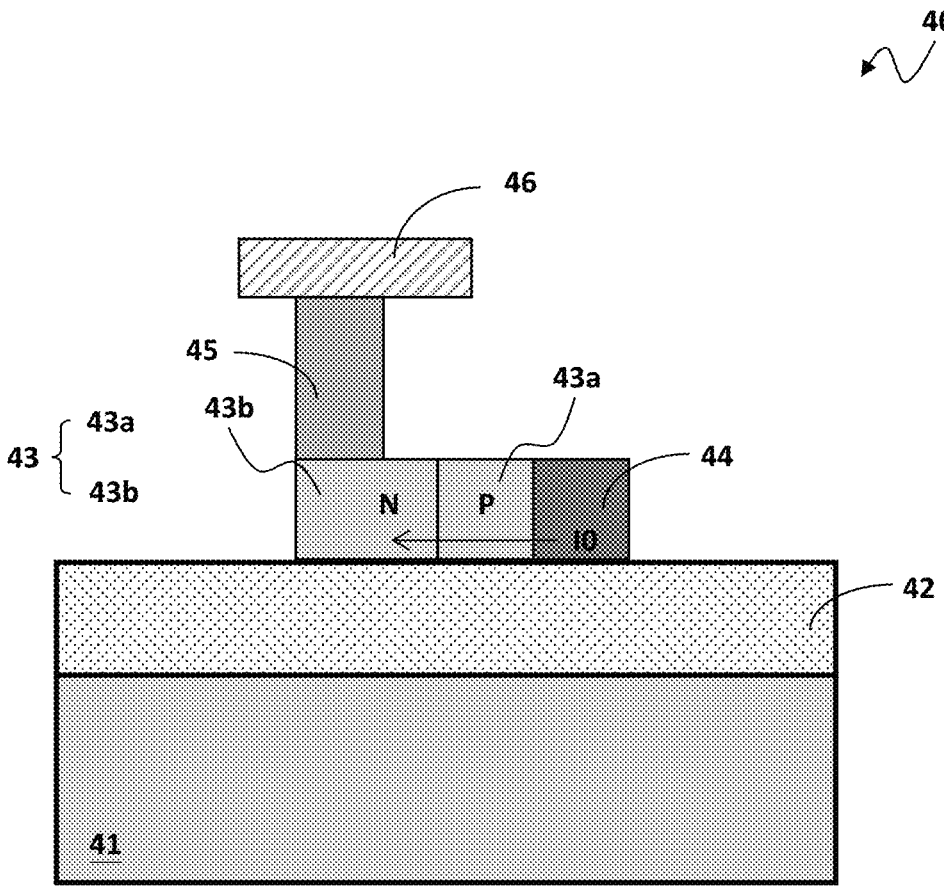
FIG. 4A and FIG. 4B respectively show a cross-sectional diagram and a three-dimensional diagram of a non-volatile memory device according to an embodiment of the present invention.
Figure 4B:
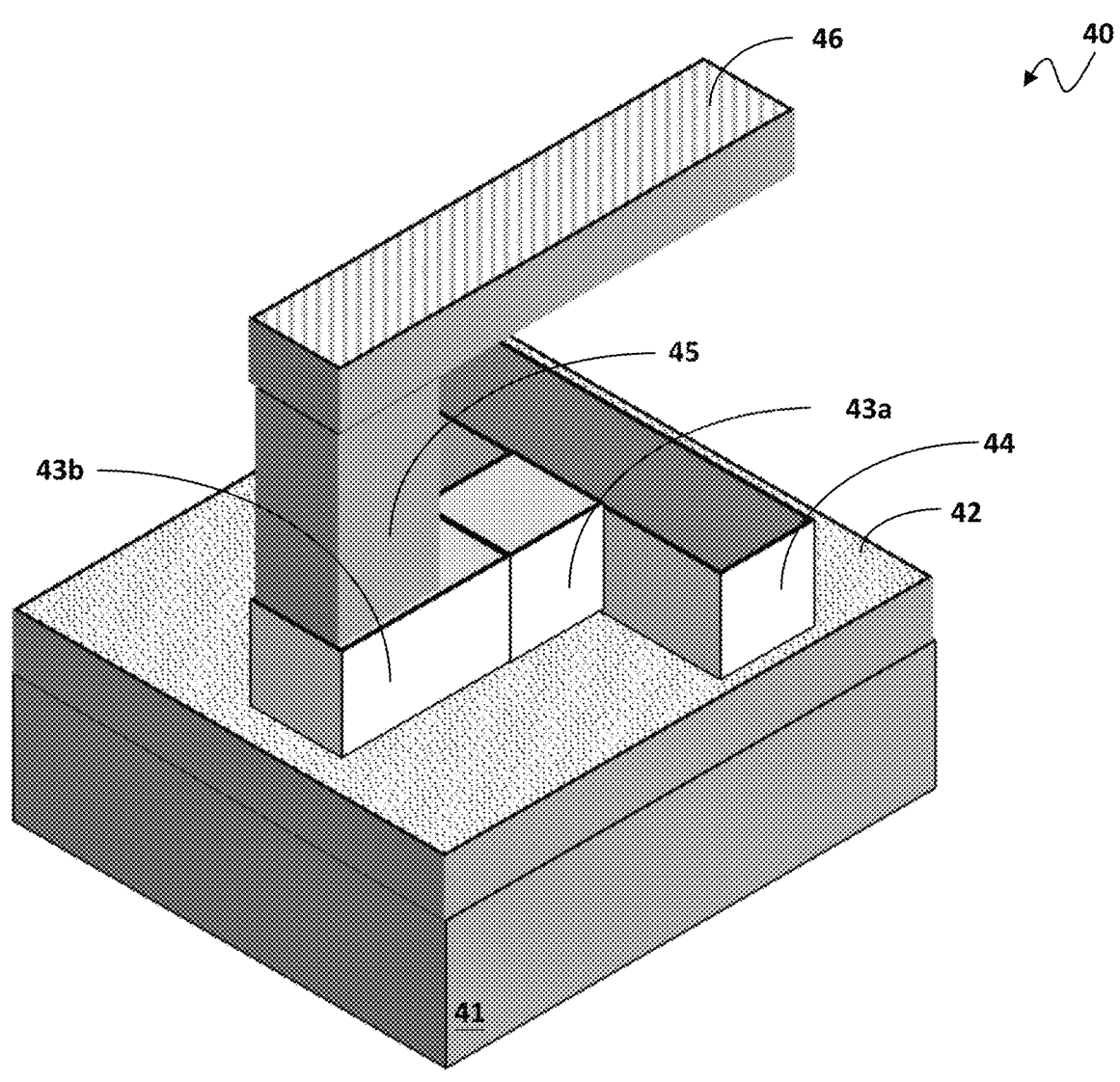

Please refer to FIG. 4A and FIG. 4B, which respectively show a cross-sectional diagram and a three-dimensional diagram of a non-volatile memory device according to an embodiment of the present invention. A non-volatile memory device 40 according to the present invention is formed on a semiconductor substrate 41. The non-volatile memory device 40 includes: an insulation layer 42, a PN diode 43, a writing wire 44, a memory unit 45 and a selection wire 46. The insulation layer 42 is formed on the semiconductor substrate 41, wherein the insulation layer 42 is electrically insulative. The PN diode 43 is formed in a monocrystalline silicon layer, a monocrystalline germanium layer or a monocrystalline gallium arsenide layer on the insulation layer 42. The PN diode 43 can be formed by, for example but not limited to, ion implantation process steps which respectively implants P-conductivity type impurities and N-conductivity type impurities in an anode end 43a and a cathode end 43b of the PN diode 43 in the form of accelerated ions, to form the PN diode 43. The writing wire 44 is conductive and the writing wire 44 is electrically connected to the anode end 43a (i.e., P-conductivity type end in this embodiment) of the PN diode 43. The PN diode 43 has a characteristic of one-way conduction. The memory unit 45 is located on the PN diode 43. The memory unit 45 is electrically connected to the cathode end 43b (i.e., N-conductivity type end in this embodiment) of the PN diode 43. The selection wire 46 is conductive, wherein the selection wire 46 is located on the memory unit 45 and is electrically connected to the memory unit 45. In a case where the non-volatile memory device 40 is selected for a data to be written into, a first current I0 flows through the PN diode 43, so as to write the data into the memory unit 45.

An addressing operation by the selection wire 46 and the writing wire 44 determines a specific address of the memory unit 45, so as to write data into the address of. That is, by adjusting a voltage level of the selection wire 46 and a voltage level of the writing wire 44 to conduct the PN diode 43, the first current I0 flows from the writing wire 44, through the PN diode 43 and the memory unit 45, to the selection wire 46, so as to write data into the memory unit 45. According to the present invention, the memory unit 45 can be a phase change area of a PCRAM device, a magnetic area of an MRAM device or a resistance change area of a RRAM device. The "data" can be, for example but not limited to, an electric characteristic indicative of "1" or "0". Such electric characteristic can be, for example but not limited to, a crystallization status, a magnetization orientation, or a resistance of a material.

Figure 4C:
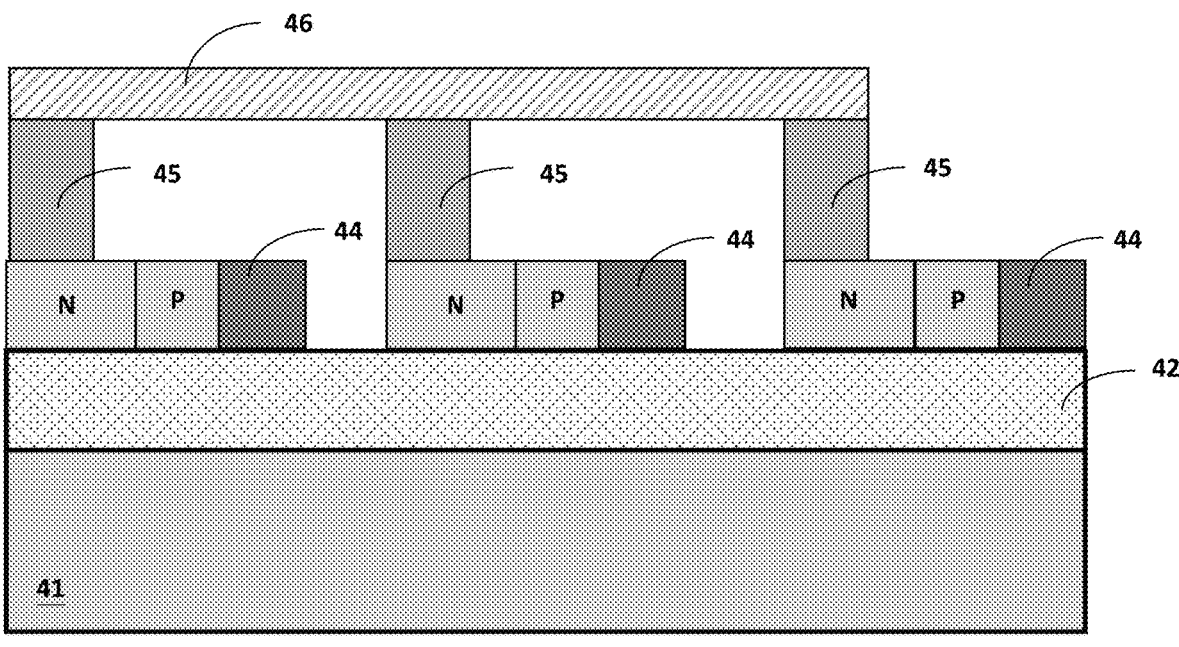
FIG. 4C shows a cross-sectional diagram, which illustrates an embodiment as to how plural non-volatile memory devices 40 of FIG. 4A and FIG. 4B can be arranged to connect to one selection wire 46.

Please refer to FIG. 4C, which shows a cross-sectional diagram, illustrating an embodiment as to how plural non-volatile memory devices 40 of FIG. 4A and FIG. 4B can be arranged to connect to one selection wire 46. As shown in FIG. 4C, in one embodiment, plural non-volatile memory devices 40 can be arranged along one same selection wire 46 in consecutive fashion. Thus, when there are plural selection wires 46, a non-volatile memory device array is formed by plural non-volatile memory devices 40 arranged by rows and columns.

Figure 4D:
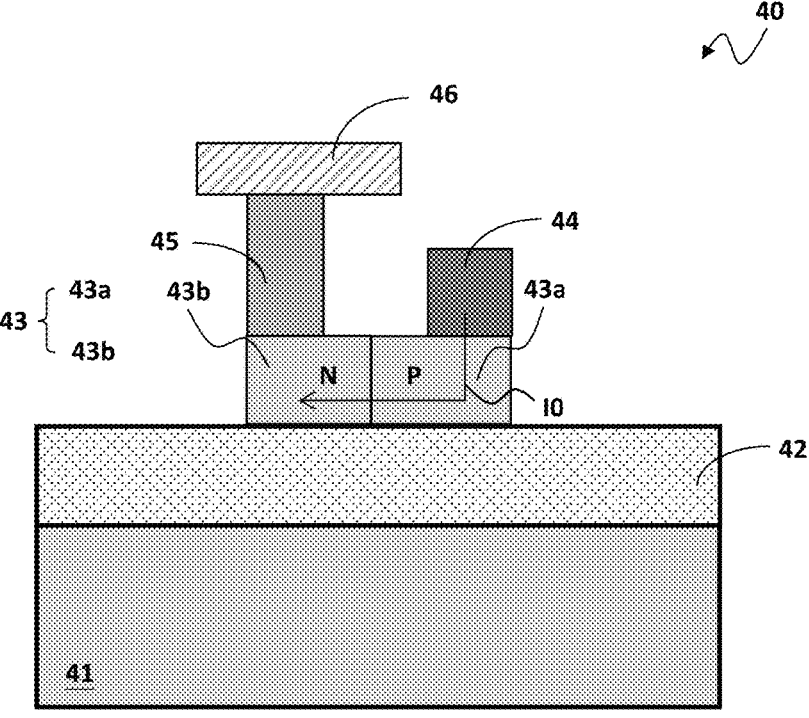
FIG. 4D shows a cross-sectional diagram of a non-volatile memory device according to an embodiment of the present invention.

Please refer to FIG. 4D, which shows a cross-sectional diagram of a non-volatile memory device according to an embodiment of the present invention. This embodiment of FIG. 4D is different from the embodiment of FIG. 4A and FIG. 4B in that: in this embodiment, the writing wire 44 is stacked and connected on the anode end 43a (i.e., P-conductivity type end in this embodiment) of the PN diode 43, which is different from the writing wire 44 in the embodiment of FIG. 4A wherein the writing wire 44 is electrically connected to the anode end 43a of the PN diode 43 along a horizontal direction. That is, the writing wire 44 can be electrically connected to the anode end 43a of the PN diode 43 at its lateral side along a horizontal direction, as shown in FIG. 4A; or, the writing wire 44 can be electrically connected to the anode end 43a of the PN diode 43 along a vertical direction, as shown in FIG. 4D.

Figure 4F:
FIG. 4F shows a schematic diagram of a non-volatile memory circuit according to an embodiment of the present invention.

FIG. 4F shows a schematic diagram of a non-volatile memory circuit according to an embodiment of the present invention. As shown in FIG. 4F and also referring to FIGS. 4A-4C, the non-volatile memory circuit 4 includes: a non-volatile memory device array 400 including plural non-volatile memory devices 40; and a control circuit 410 controlling the non-volatile memory device array 400 so as to read from or write into the non-volatile memory devices 40; wherein the non-volatile memory device 40, as shown by FIGS. 4A-4C, includes: an insulation layer 42, which is electrically insulative; a PN diode 43, which is formed in a monocrystalline silicon layer, a monocrystalline germanium layer or a monocrystalline gallium arsenide layer on the insulation layer 42; a writing wire 44 which is conductive, wherein the writing wire 44 is electrically connected to an anode end 43a of the PN diode 43; a memory unit 45, which is located on the PN diode 43, wherein the memory unit 45 is electrically connected to a cathode end 43b of the PN diode 43; and a selection wire 46 which is conductive, wherein the selection wire 46 is located on the memory unit 45 and is electrically connected to the memory unit 45; wherein in a case where the non-volatile memory device 40 is selected for a data to be written into, a current I0 flows through the PN diode 43, so as to write the data into the memory unit 45.

The present invention is advantageous over the prior art due to at least the following reasons: first, according to the present invention, the non-volatile memory device can adopt a one-way conduction type selector (i.e., PN diode) rather than a two-way conduction type selector as adopted by the prior art. Because the PN diode occupies a relatively smaller area, the present invention can save the space occupied by the selector and the device size is smaller. Second, according to the present invention, because the non-volatile memory device can adopt a one-way conduction type selector (i.e., PN diode), the present invention will not be limited by the electric characteristics of a two-way conduction type selector (e.g., MOS device) as adopted by the prior art. As the present invention adopts for example a PN diode as the selector, because the conduction current of the PN diode is larger than the conduction current of the MOS device, the present invention can have a broader application range. Third, as compared to the prior art where a two-way conduction type selector (e.g., MOS device) is adopted, because a one-way conduction type selector (i.e., PN diode) adopted by the non-volatile memory device of the present invention is directly electrically connected to the writing wire 44, the leakage current is significantly reduced. Moreover, in one embodiment, the writing wire 44 of the present invention can be formed on the insulation layer, which can provide good electric insulation from other conductive regions and thus has a better insulation effect than the prior arts to further reduce the leakage current. Under such implementation, for example, in one embodiment, the writing wire 44 of the non-volatile memory device 40 of this embodiment can be formed on the insulation layer 42. Furthermore, when the present invention is applied to an application including plural PN diodes (the details of which will be more fully explained later), the present invention can be used to replace the bi-directional channel or multi-directional control (e.g., in an SOT-MRAM device), to ensure the currents flowing through the bi-directional channel to be substantially equal to each other.

Figure 5A:
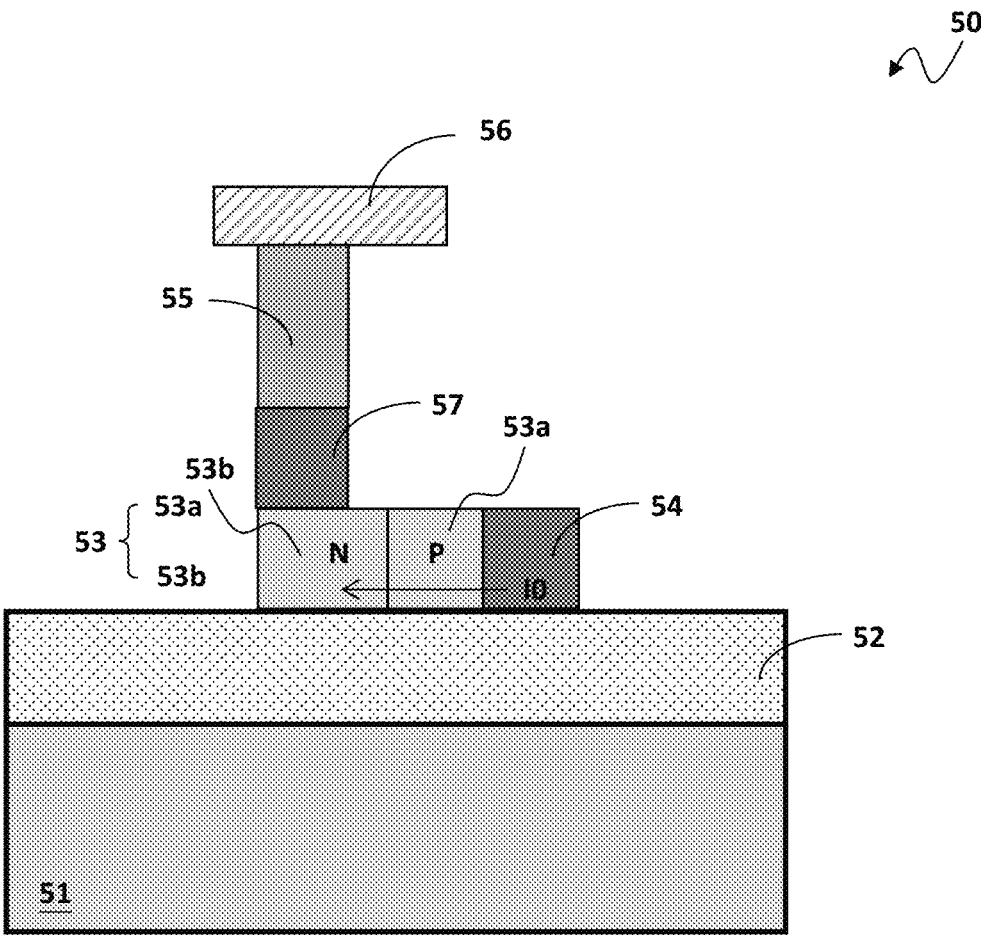
FIG. 5A and FIG. 5B respectively show a cross-sectional diagram and a three-dimensional diagram of a non-volatile memory device according to an embodiment of the present invention.
Figure 5B:
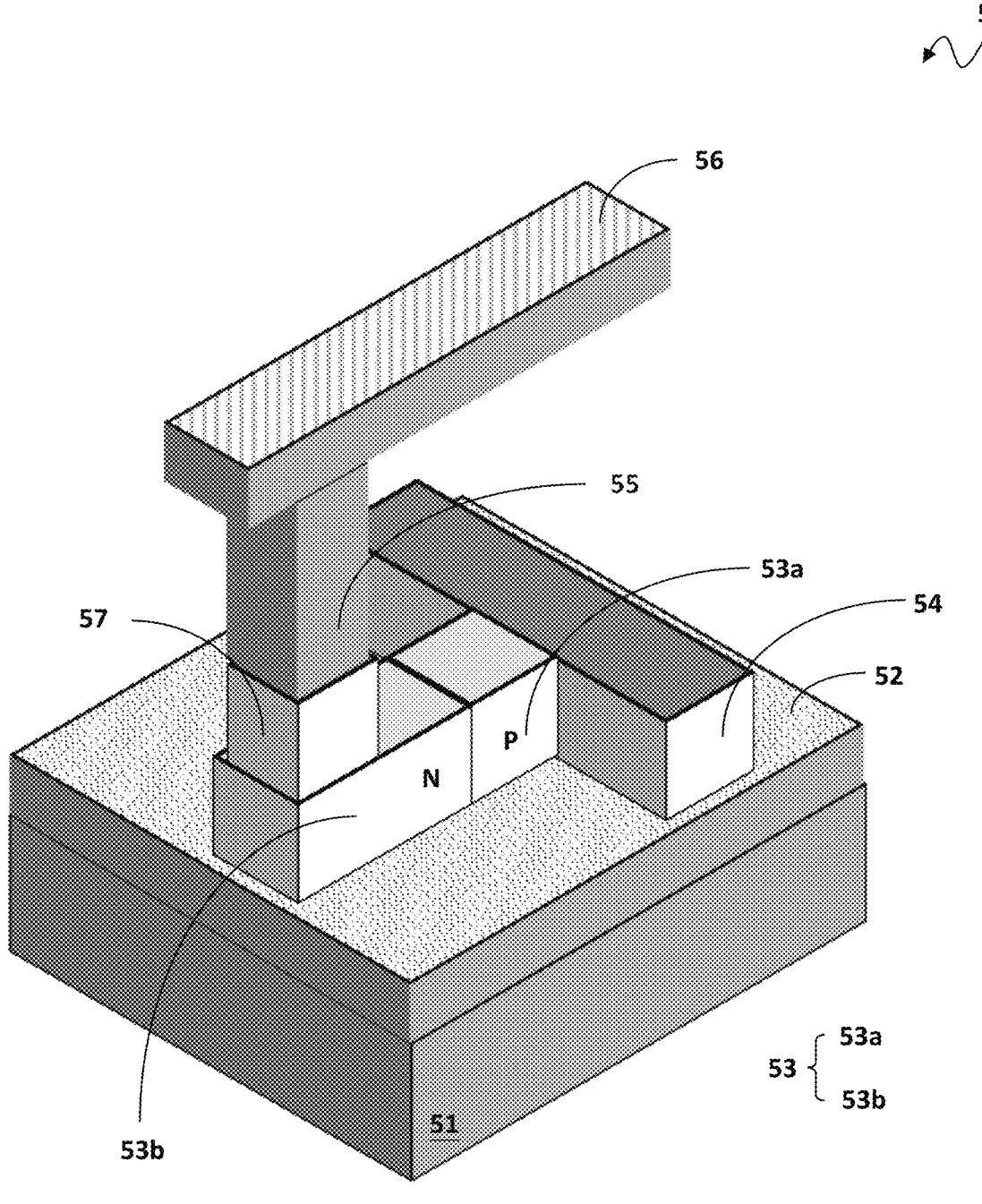

Please refer to FIG. 5A and FIG. 5B, which respectively show a cross-sectional diagram and a three-dimensional diagram of a non-volatile memory device according to an embodiment of the present invention. A non-volatile memory device 50 according to the present invention is formed on a semiconductor substrate 51. The non-volatile memory device 50 includes: an insulation layer 52, a PN diode 53, a writing wire 54, a memory unit 55, a selection wire 56 and a connection conduction unit 57. The insulation layer 52 is formed on the semiconductor substrate 51, wherein the insulation layer 52 is electrically insulative. The PN diode 53 is formed in a monocrystalline silicon layer a monocrystalline silicon layer, a monocrystalline germanium layer or a monocrystalline gallium arsenide layer on the insulation layer 52. The PN diode 43 can be formed by, for example but not limited to, ion implantation process steps which respectively implants P-conductivity type impurities and N-conductivity type impurities in an anode end 53*a* and a cathode end 53*b* of the PN diode 53 in the form of accelerated ions, to form the PN diode 53. The writing wire 54 is conductive and the writing wire 54 is electrically connected to the anode end 53*a* (i.e., P-conductivity type end in this embodiment) of the PN diode 53. The PN diode 53 has a characteristic of one-way conduction. The memory unit 55 is located above the PN diode 53. The memory unit 55 is electrically connected to the cathode end 53*b* (i.e., N-conductivity type end in this embodiment) of the PN diode 53. The selection wire 56 is conductive, wherein the selection wire 56 is located on the memory unit 55 and is electrically connected to the memory unit 55. In a case where the non-volatile memory device 50 is selected for a data to be written into, a first current I0 flows through the PN diode 53, so as to write the data into the memory unit 55.

This embodiment of FIG. 5A and FIG. 5B is different from the embodiment of FIG. 4A and FIG. 4B in that: in this embodiment, the non-volatile memory device 50 further incudes the connection conduction unit 57, which is conductive. The connection conduction unit 57 is configured to electrically connect the memory unit 55 to the cathode end 53*b* (i.e., N-conductivity type end in this embodiment) of the PN diode 53. In this embodiment, as shown in FIG. 5A and FIG. 5B, the connection conduction unit 57 can be, for example but not limited to, stacked and connected on the cathode end 53*b* of the PN diode 53. And, the memory unit 55 is stacked and connected on the connection conduction unit 57.

Figure 6A:
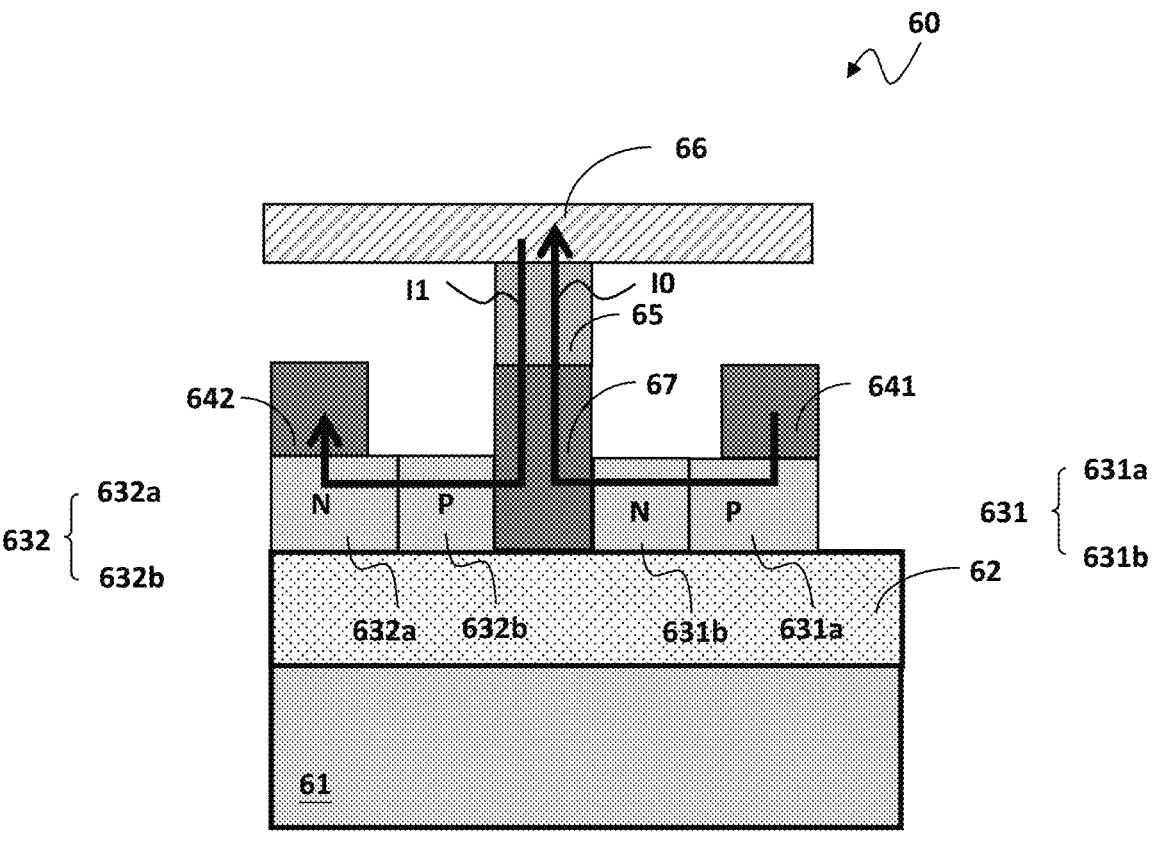
FIG. 6A and FIG. 6B respectively show a cross-sectional diagram and a three-dimensional diagram of a non-volatile memory device according to an embodiment of the present invention.
Figure 6B:
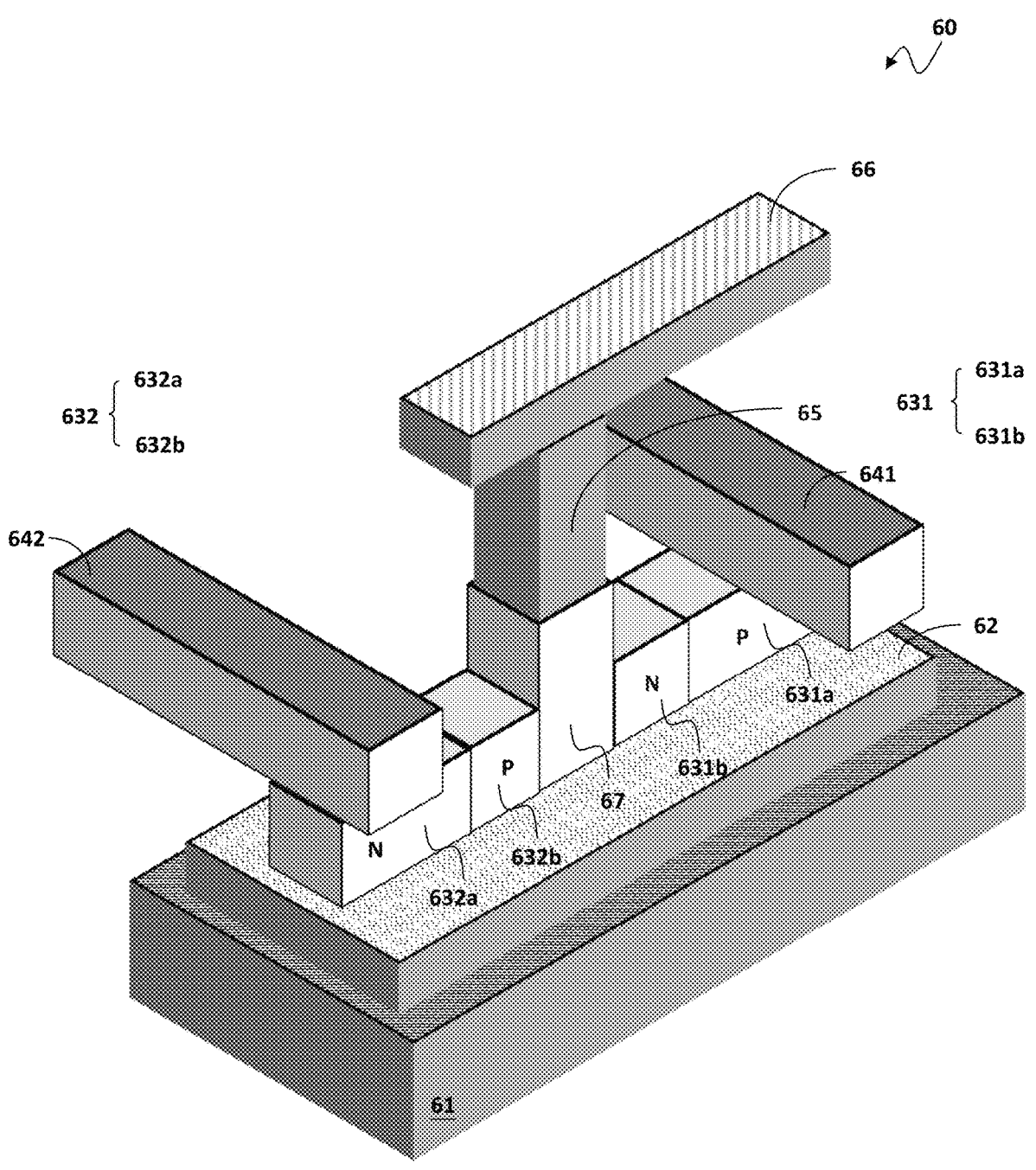

Please refer to FIG. 6A and FIG. 6B, which respectively show a cross-sectional diagram and a three-dimensional diagram of a non-volatile memory device according to an embodiment of the present invention. A non-volatile memory device 60 according to the present invention is formed on a semiconductor substrate 61. In this embodiment, the non-volatile memory device 60 includes: an insulation layer 62, writing wires 641 and 642, PN diodes 631 and 632, a memory unit 65, a selection wire 66 and a connection conduction unit 67. The insulation layer 62 is formed on the semiconductor substrate 61, wherein the insulation layer 62 is electrically insulative. The PN diode 631 is formed in a monocrystalline silicon layer, a monocrystalline germanium layer or a monocrystalline gallium arsenide layer on the insulation layer 62. The PN diode 631 can be formed by, for example but not limited to, ion implantation process steps which respectively implant P-conductivity type impurities and N-conductivity type impurities in an anode end 631*a* and a cathode end 631*b* of the PN diode 631 in the form of accelerated ions, to form the PN diode 631. In this embodiment, the PN diode 631 is stacked and connected on the insulation layer 62. And, the anode end 631*a* and the cathode end 631*b* of the PN diode 631 can be, for example but not limited to, adjacently connected to each other (i.e. in contact with each other) along a horizontal direction. The non-volatile memory device 60 of this embodiment further includes the PN diode 632. The PN diode 632 is formed in the monocrystalline silicon layer, the monocrystalline germanium layer or the monocrystalline arsenide layer on the insulation layer 62. The PN diode 632 can be formed by, for example but not limited to, ion implantation process steps which respectively implant N-conductivity type impurities and P-conductivity type impurities in an cathode end 632*a* and a anode end 632*b* of the PN diode 632 in the form of accelerated ions, to form the PN diode 632. In this embodiment, the PN diode 632 is stacked and connected on the insulation layer 62. And, the cathode end 632*a* and the anode end 632*b* of the PN diode 632 can be, for example but not limited to, adjacently connected to each other (i.e. in contact with each other) along a horizontal direction.

The writing wire 641 is conductive and the writing wire 641 is electrically connected to the anode end 631*a* (i.e., P-conductivity type end in this embodiment) of the PN diode 631. In this embodiment, the writing wire 641 can be, for example but not limited to, stacked and connected on the anode end 631*a*. The writing wire 642 is conductive and the writing wire 642 is electrically connected to the cathode end 632*a* (i.e., N-conductivity type end in this embodiment) of the PN diode 632. In this embodiment, the writing wire 642 can be, for example but not limited to, stacked and connected on the cathode end 632*a*. The memory unit 65 is located above the PN diodes 631 and 632. The memory unit 65 is electrically connected to the cathode end 631*b* (i.e., N-conductivity type end in this embodiment) of the PN diode 631 and the anode end 632*b* (i.e., P-conductivity type end in this embodiment) of the PN diode 632 by the connection conduction unit 67. In this embodiment, the connection conduction unit 67 lies between the cathode end 631*b* and the anode end 632*b*. In this embodiment, the selection wire 66 is located on the memory unit 65 and is electrically connected to the memory unit 65. In a case where the non-volatile memory device 60 is selected for a data to be written into, a first current I0 flows through the PN diode 631, so as to write the data into the memory unit 65. In a case where the non-volatile memory device 60 for another data to be written into, a second current I1 flows through the PN diode 632, so as to write the other data into the memory unit 65. It is noteworthy that, in this embodiment, the flowing direction of the first current I0 through the memory unit 65 is opposite to the flowing direction of the second current I1 through the memory unit 65.

In one embodiment, the PN diodes 631 and 632 are formed in the monocrystalline silicon layer, the monocrystalline germanium layer or the monocrystalline gallium arsenide layer on the insulation layer 62. As shown in FIG. 6A, in one preferred embodiment, the PN diodes 631 and 632 are both two-end devices (e.g., not diode-connected MOS devices). The PN diodes 631 and 632 can be formed through doping P-conductivity type impurities and N-conductivity type impurities in the monocrystalline silicon layer, the monocrystalline germanium layer or the monocrystalline gallium arsenide layer, so as to form a PN junction for the PN diode 631 and a PN junction for the PN diode 632. It is noteworthy that, according to the present invention, the directions of the PN junctions of the PN diodes 631 and 632 can be modified; the directions of the PN junctions of the PN diodes 631 and 632 are not limited to the implementation as shown, wherein the N-conductivity type region is at the left side of FIG. 6A, and the P-conductivity type region is at right side of FIG. 6A. It should be understood that such implementation in the above-mentioned preferred embodiment of FIG. 6A is only an illustrative example, but not for limiting the broadest scope of the present invention. In other embodiments, it is also practicable and within the scope of the present invention that the P-conductivity type region is at an upper position while the N-conductivity type region is at a lower position, or the P-conductivity type region is a lower position while the N-conductivity type region is an upper position (i.e., the P-conductivity type region and N-conductivity type region can be arranged to be in contact with each other along a vertical direction rather than along a horizontal direction). In one embodiment, the writing wires 641 and 642 are made of metal. Such metal wire can include, for example but not limited to, metal materials made of aluminum (Al), copper (Cu) or AlCu alloy. In one embodiment, the selection wires and the writing wires of the present invention can be both made of metal.

According to the present invention, in one embodiment, as shown in this embodiment, the non-volatile memory device is formed on a semiconductor-on-insulator (SOI) substrate or a semiconductor-metal-on-insulator (SMOI) substrate. SOI substrate and SMOI substrate are well known to those skilled in the art, so the details thereof are not redundantly explained here.

Figure 7A:
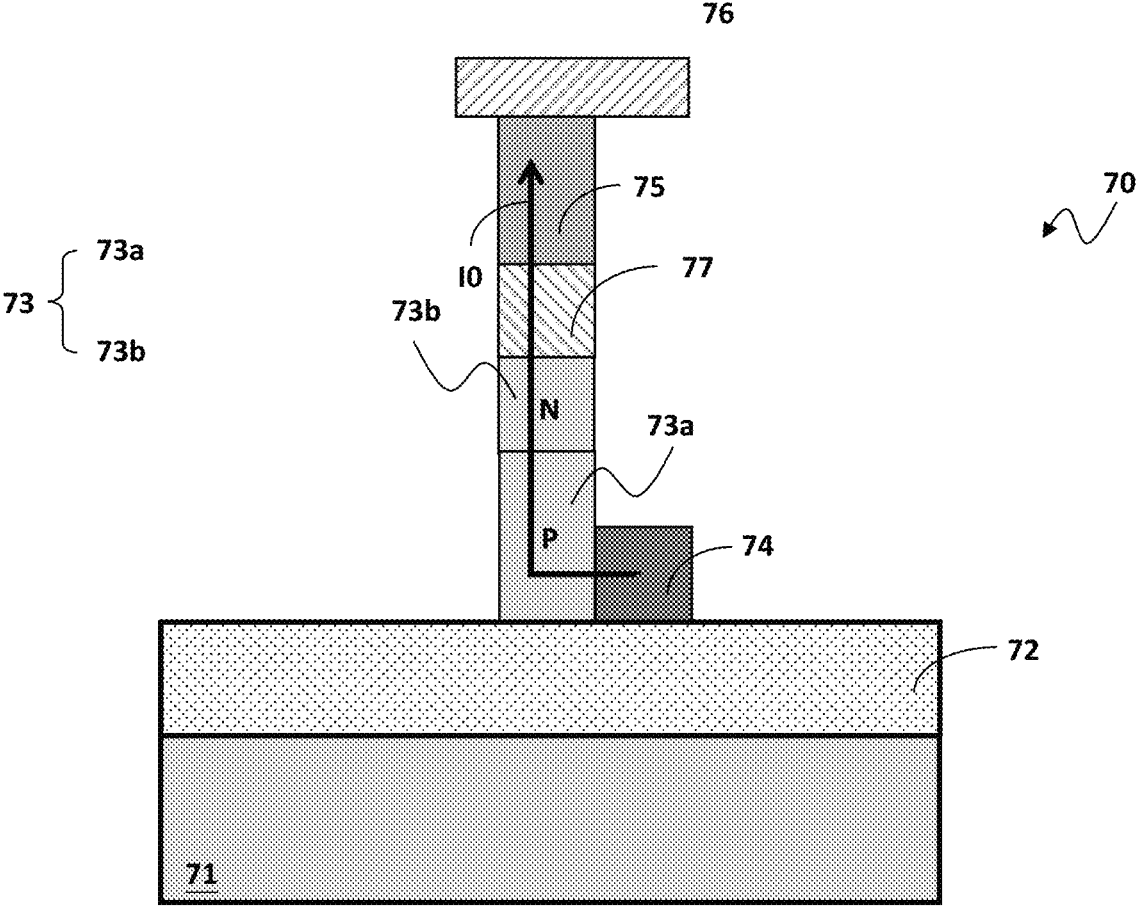
FIG. 7A and FIG. 7B respectively show a cross-sectional diagram and a three-dimensional diagram of a non-volatile memory device according to an embodiment of the present invention.
Figure 7B:
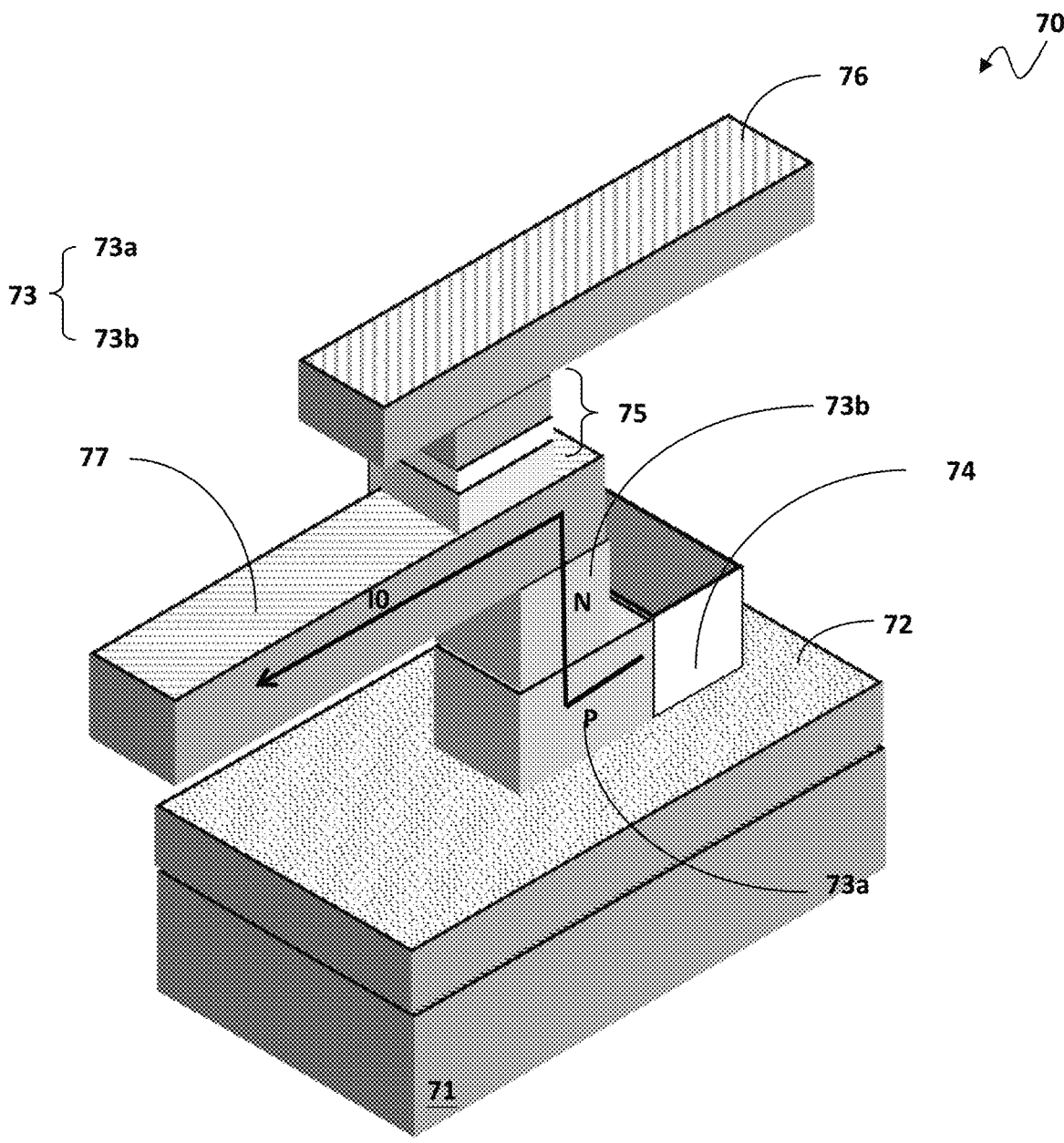

Please refer to FIG. 7A and FIG. 7B, which respectively show a cross-sectional diagram and a three-dimensional diagram of a non-volatile memory device according to an embodiment of the present invention.

As shown in FIG. 7A, a non-volatile memory device 70 according to the present invention is formed on a semiconductor substrate 71. The non-volatile memory device 70 includes: an insulation layer 72, a writing wire 74, a PN diode 73, a memory unit 75, a selection wire 76 and a connection conduction unit 77. The insulation layer 72 is formed on the semiconductor substrate 71, wherein the insulation layer 72 is electrically insulative. The PN diode 73 is located on the insulation layer and is formed in a monocrystalline silicon layer, a monocrystalline germanium layer or a monocrystalline gallium arsenide layer. The writing wire 74 is conductive and the writing wire 74 is electrically connected to an anode end 73a (i.e., P-conductivity type end in this embodiment) of the PN diode 73. The PN diode 73 has a characteristic of one-way conduction. The memory unit 75 is located above the PN diode 73. The memory unit is electrically connected to a cathode end 73b (i.e., N-conductivity type end in this embodiment) of the PN diode 73. The selection wire 76 is conductive, wherein the selection wire 76 is located on the memory unit 75 and is electrically connected to the memory unit 75. In a case where the non-volatile memory device 70 for a data to be written into, a first current I0 flows through the PN diode 73, so as to write the data into the memory unit 75.

This embodiment of FIG. 7A and FIG. 7B is different from the embodiment of FIG. 4A and FIG. 4B, in that: in this embodiment, the non-volatile memory device 70 further incudes the connection conduction unit 77, which is electrically connected between the PN diode 73 and the memory unit 75. The connection conduction unit 77 is conductive and for example can be made of a metal wire or a metal connection plug. The connection conduction unit 77 is configured to electrically connect the memory unit 75 to the cathode end 73b of the PN diode 73. Additionally, in this embodiment, the cathode end 73b of the PN diode 73 is stacked and connected on the anode end 73a of the PN diode 73. According to the present invention, in one embodiment, the cathode end 73b of the PN diode 73 can be implemented as being connected to the anode end 73a of the PN diode 73 along a horizontal direction, as shown in FIG. 4A and FIG. 4B; or, in another embodiment, the cathode end 73b of the PN diode 73 can be implemented as being stacked and connected on the anode end 73a of the PN diode 73 along a vertical direction, as shown in FIG. 7A and FIG. 7B.

It is noteworthy that, as the non-volatile memory device 70 is adopted in different applications, the first current I0 can accordingly have different corresponding current flow paths. For example, referring to FIG. 7A, in a case where the non-volatile memory device 70 is a PCRAM device, the memory unit 75 is correspondingly a phase change area. Under such circumstance, as shown in FIG. 7A, the first current I0 flows along a current flow path in which the first current I0 flows from the PN diode 73, through the connection conduction unit 77 to the memory unit 75, to change crystallization status of the material in the memory unit 75. Under such circumstance, the selection wire 76 for example can be electrically connected to a ground level. For another example, as shown in FIG. 7B, in a case where the non-volatile memory device 70 is a spin orbit torque (SOT) type MRAM device, the memory unit 75 is correspondingly a magnetic area. Under such circumstance, as shown in FIG. 7B, the first current I0 flows along a current flow path in which the first current I0 flows from the PN diode 73 through the connection conduction unit 77 without flowing through the memory unit 75 (as shown by the arrow in FIG. 7B), to change a magnetization orientation of the electrode in the memory unit 75 so as to change the resistance of the memory unit 75, whereby data can be written into the memory unit 75.

Figures 8A, 8C:
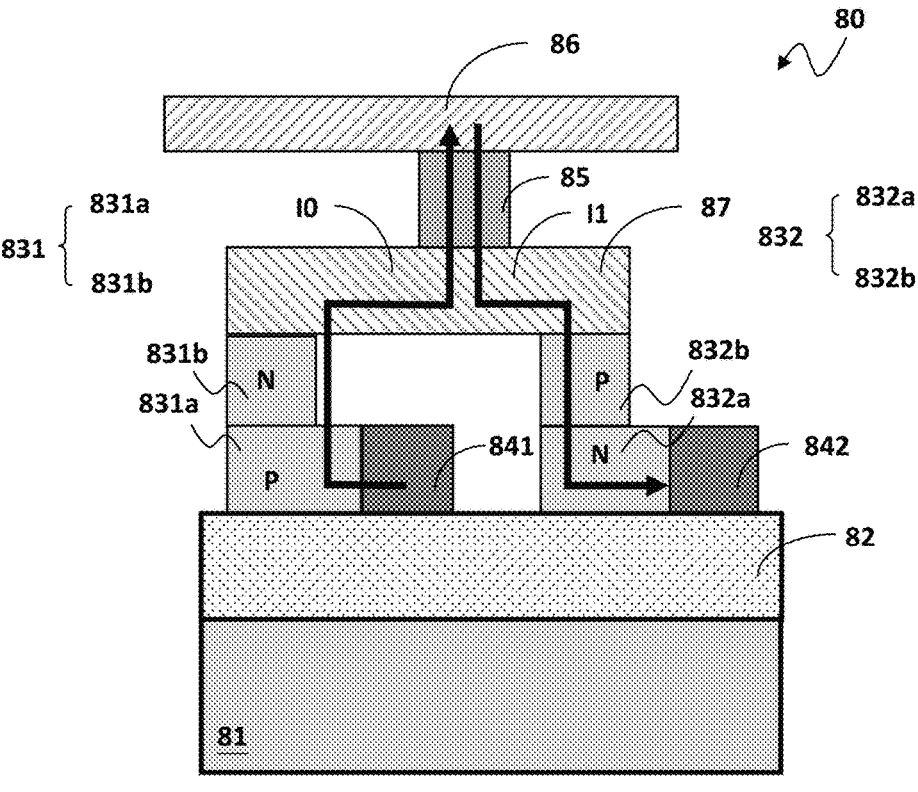
Figure 8B:
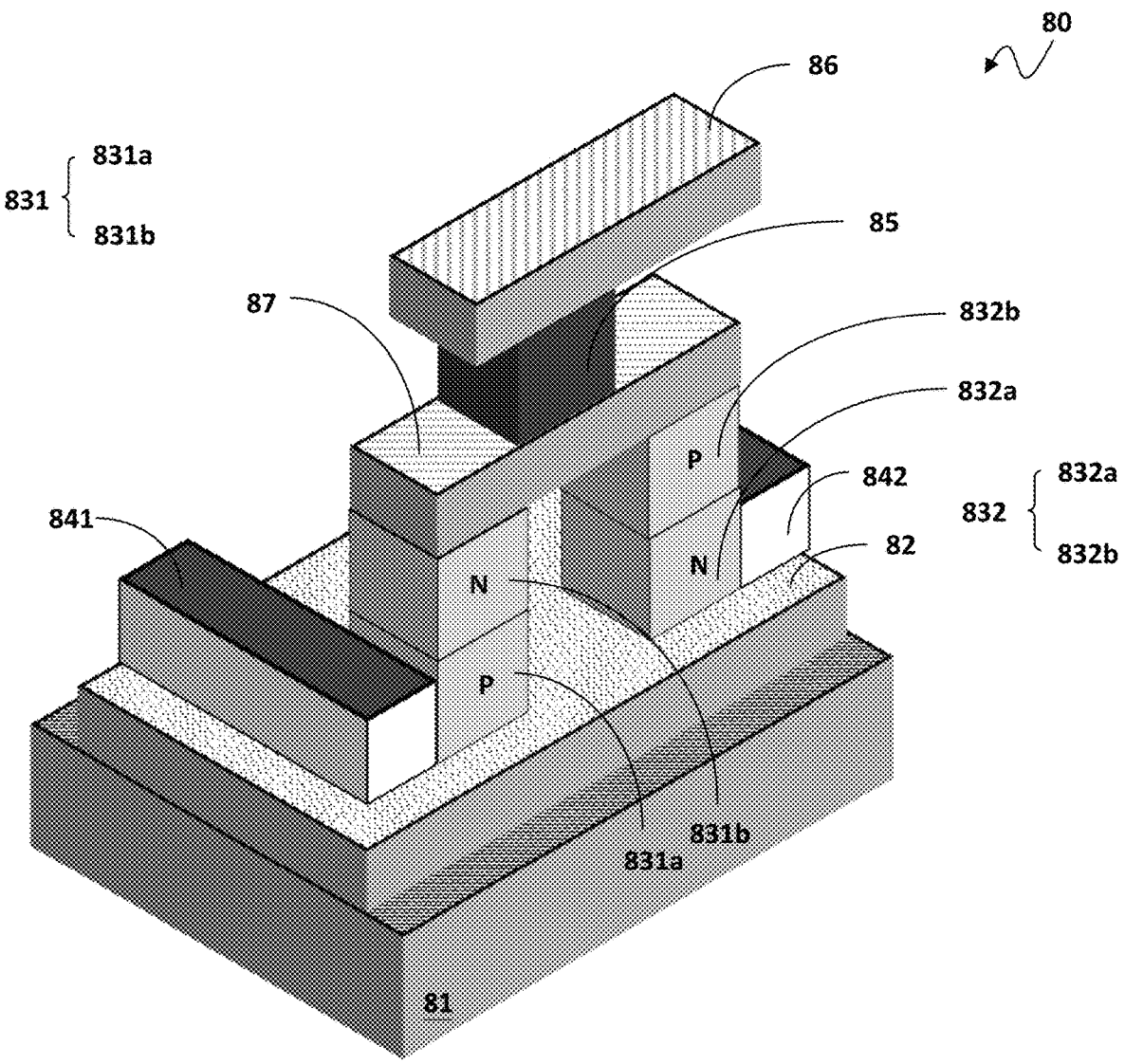

Please refer to FIG. 8A, FIG. 8B and FIG. 8C. FIG. 8A and FIG. 8B respectively show a cross-sectional diagram and a three-dimensional diagram of a non-volatile memory device according to an embodiment of the present invention, while, FIG. 8C shows an operation table corresponding to an operation of FIG. 8A and FIG. 8B. As shown in FIG. 8A and FIG. 8B, a non-volatile memory device 80 according to the present invention is a three-end device and is formed on a semiconductor substrate 81. The non-volatile memory device 80 includes: an insulation layer 82, writing wires 841 and 842, PN diodes 831 and 832, a memory unit 85, a selection wire 86 and a connection conduction unit 87. The three ends of the non-volatile memory device 80 are: the writing wire 841, the writing wire 842 and the selection wire 86, respectively.

The insulation layer 82 is formed on the semiconductor substrate 81, wherein the insulation layer 82 is electrically insulative. The PN diode 831 and the PN diode 832 are formed in a monocrystalline silicon layer, a monocrystalline germanium layer or a monocrystalline gallium arsenide layer on the insulation layer 82. The writing wire 841 and the writing wire 842 are conductive. The writing wire 841 is electrically connected to an anode end 831a (i.e., P-conductivity type end in this embodiment) of the PN diode 831, whereas, the writing wire 842 is electrically connected to a cathode end 832a (i.e., N-conductivity type end in this embodiment) of the PN diode 832. And, the PN diode 831 and the PN diode 832 are one-way conductive. The memory unit 85 is located above the PN diodes 831 and 832. The memory unit 85 is electrically connected to the cathode end 831b (i.e., N-conductivity type end in this embodiment) of the PN diode 831 and the anode end 832b (i.e., P-conductivity type end in this embodiment) of the PN diode 832 by the connection conduction unit 87. The selection wire 86 is located on the memory unit 85 and is electrically connected to the memory unit 85. In a case where the non-volatile memory device 80 is selected for a data to be written into, a first current I0 flows through the PN diode 831, so as to write the data into the memory unit 85. In a case where the non-volatile memory device 80 is selected for another data to be written into, a second current I1 flows through the PN diode 832, so as to write the other data into the memory unit 85. It is noteworthy that, in this embodiment, the flowing direction of the first current I0 through the memory unit 85 is opposite to the flowing direction of the second current I1 through the memory unit 85.

In one embodiment as an example, as shown by the operation table in FIG. 8C, when an addressing operation selects the non-volatile memory device 80, to write a data indicative of "0" (or "1" depending on the definition of the bit) into the memory unit 85, the writing wire 841 is electrically connected to a writing voltage Vw and the selection wire 86 is electrically connected to a ground level, so as to generate the first current I0. As a result, the thus generated first current I0 flows from the writing wire 841, through the PN diode 831 (wherein the P-conductivity type region is at a lower position whereas the N-conductivity type region is at an upper position), the connection conduction unit 87 and the memory unit 85, to the selection wire 86. By this current, the non-volatile memory device 80 can write a data indicative of "0" into the memory unit 85 through changing a crystallization status of a material of a phase change area, a magnetization orientation of a magnetic area or a resistance of a resistance change area in the memory unit 85. In regard to the writing wire 842, under such situation, the writing wire 842 is electrically floating. With respect to unselected non-volatile memory devices 80, the writing wires 841 and 842 and the selection wire 86 of the unselected non-volatile memory devices 80 for example can also be electrically floating.

On the other hand, for another example, as shown by the operation table in FIG. 8C, when an addressing operation selects the non-volatile memory device 80, to write a data indicative of "1" (or "0" depending on the definition of the bit) into the memory unit 85, the selection wire 86 is electrically connected to the writing voltage Vw and the writing wire 842 is electrically connected to the ground level, so as to generate the second current I1. As a result, the thus generated second current I1 flows from the selection wire 86, through the memory unit 85, the connection conduction unit 87 and the PN diode 832 (wherein the N-conductivity type region is at a lower position whereas the P-conductivity type region is at an upper position), to the writing wire 842. By this current, the non-volatile memory device 80 can write a data indicative of "1" into the memory unit 85 through changing a crystallization status of a material of a phase change area, a magnetization orientation of a magnetic area or a resistance of a resistance change area in the memory unit 85. In regard to the writing wire 841, under such situation, the writing wire 841 is electrically floating. With respect to unselected non-volatile memory devices 80, the writing wires 841 and 842 and the selection wire 86 of the unselected non-volatile memory devices 80 for example can also be electrically floating. The writing voltage Vw for example can be a positive voltage and is at least higher than a forward conduction voltage of a PN diode, so that a current can flow from an end electrically connected to the writing voltage Vw to another end electrically connected to the ground level.

In one embodiment, the non-volatile memory device 80 can read data stored in the memory unit 85 by, for example, electrically connecting the selection wire 86 to a reading voltage Vr, and determining that the data stored in the memory unit 85 is "0" or "1" according to a voltage of the writing wire 842.

Figure 8D:
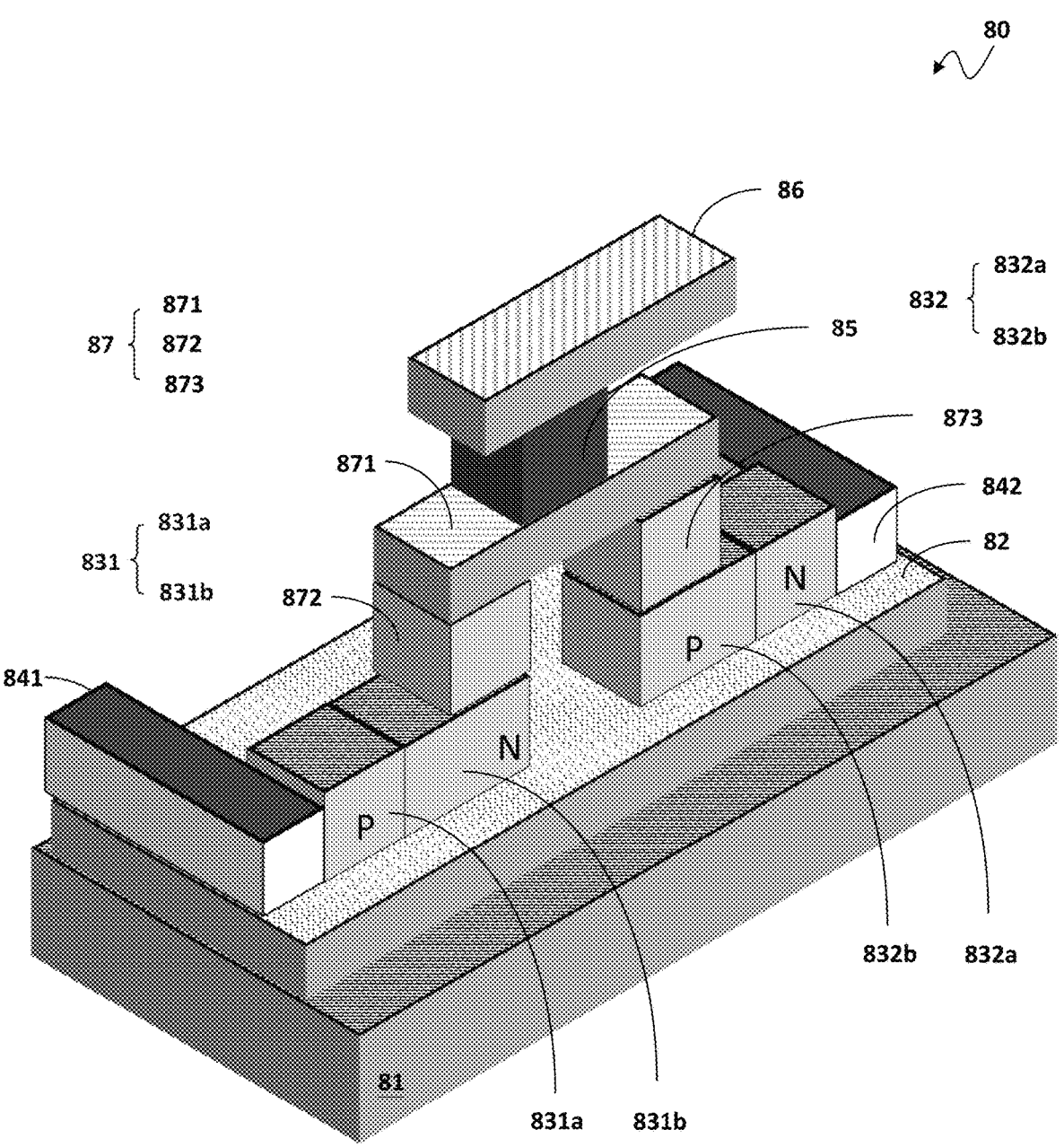
FIG. 8D shows a three-dimensional diagram of a non-volatile memory device according to an embodiment of the present invention.

Please refer to FIG. 8D, which shows a three-dimensional diagram of a non-volatile memory device according to an embodiment of the present invention. This embodiment of FIG. 8D is different from the embodiment of FIG. 8A and FIG. 8B, in that: in this embodiment, the connection conduction unit 87 includes: a first portion 871, a second portion 872 and a third portion 873. The second portion 872 is stacked and connected on a cathode end 831*b* (i.e., N-conductivity type end in this embodiment) of a PN diode 831. The third portion 873 is stacked and connected on a anode end 832*b* (i.e., P-conductivity type end in this embodiment) of a PN diode 832. The first portion 871 is stacked and connected on the second portion 872 and the third portion 873, so as to electrically connect the PN diode 831 and the PN diode 832 to the memory unit 85. Additionally, unlike the embodiment wherein the anode end 831*a* and the cathode end 831*b* of the PN diode 831 is connected to each other along a vertical direction and the cathode end 832*a* and the anode end 832*b* of the PN diode 832 is connected to each other along a vertical direction (as shown in FIG. 8A and FIG. 8B), in this embodiment, the anode end 831*a* and the cathode end 831*b* of the PN diode 831 are connected to each other along a horizontal direction and the cathode end 832*a* and the anode end 832*b* of the PN diode 832 are connected to each other along a horizontal direction.

Figures 9A, 9B:
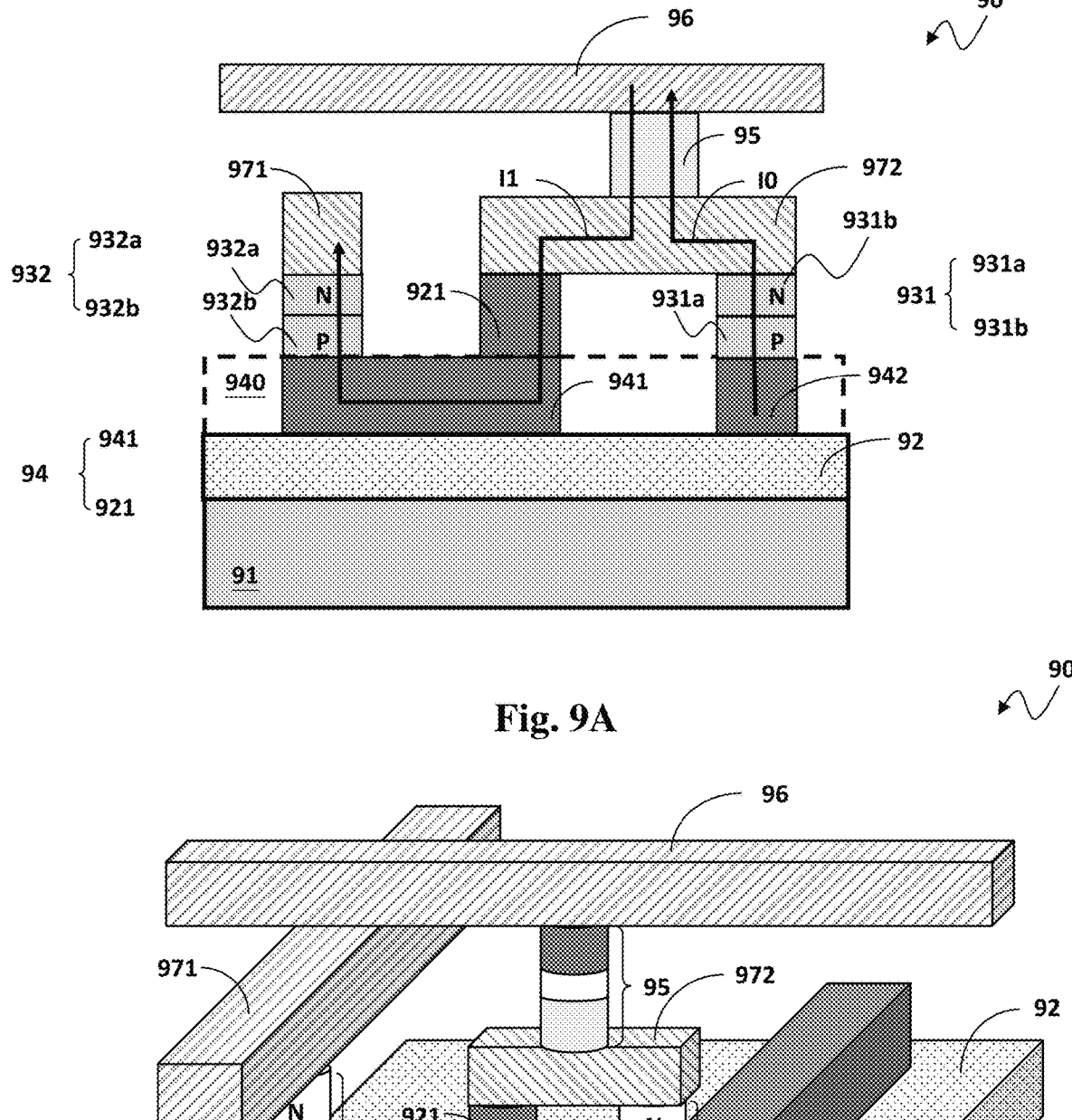
Figure 9D:
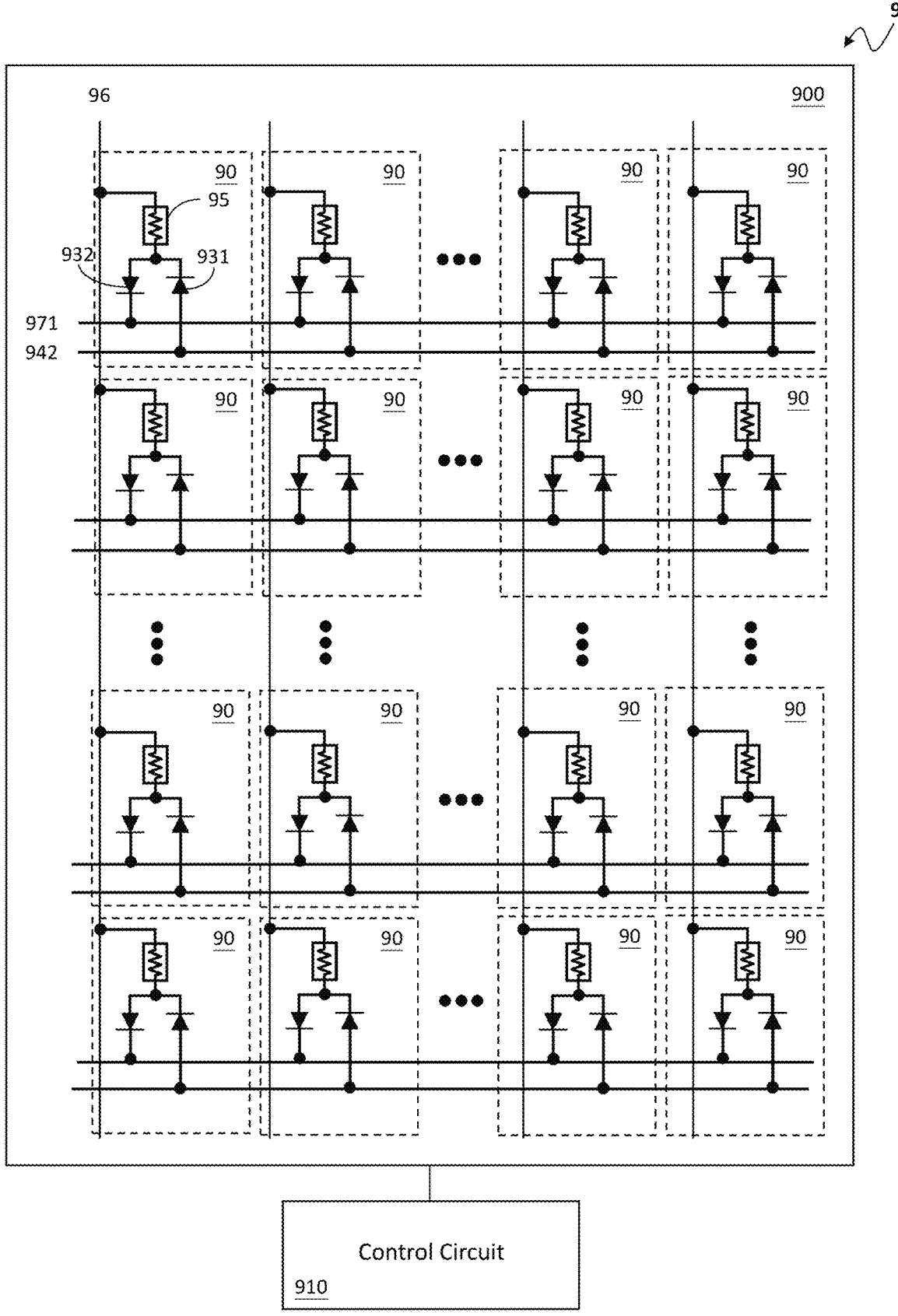
FIG. 9D shows a schematic diagram of a non-volatile memory circuit according to an embodiment of the present invention.
Figures 9C, 10:
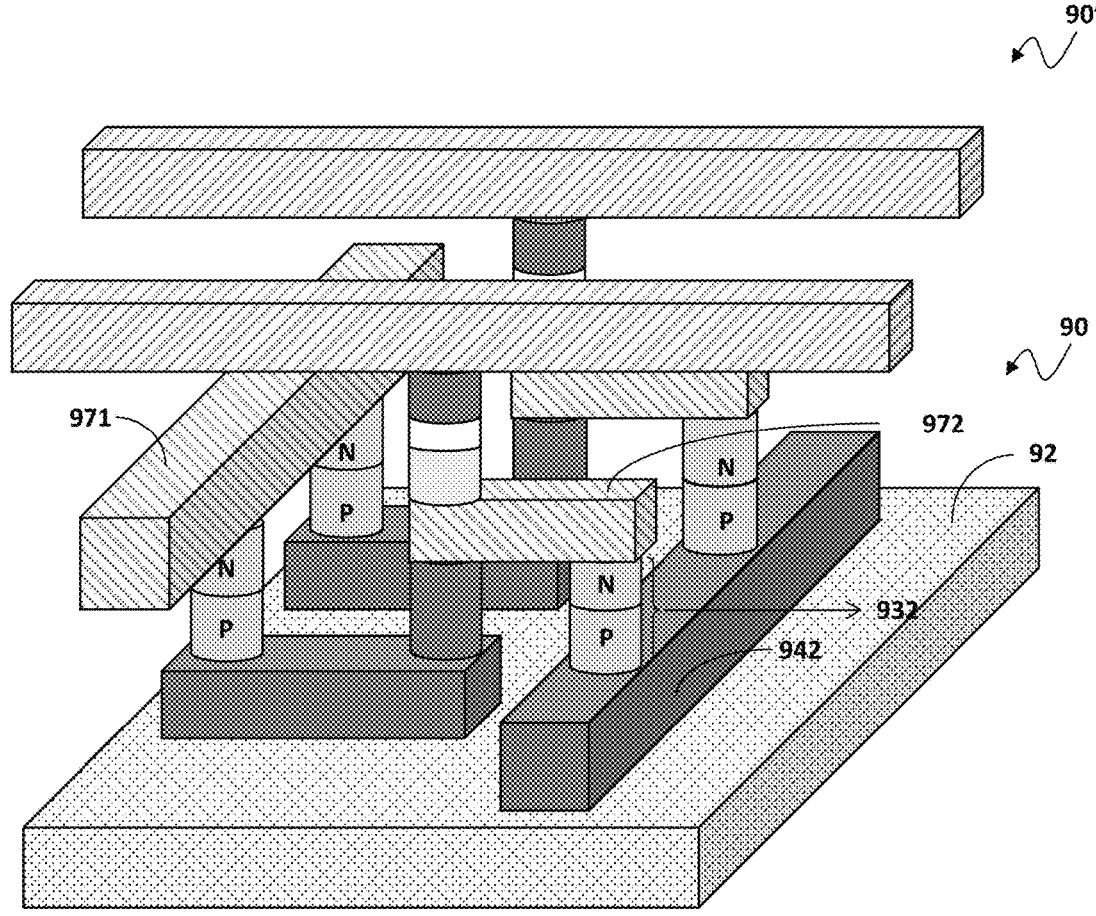
FIG. 9C shows an operation table corresponding to an operation of FIG. 9A and FIG. 9B.
FIG. 10 shows a three-dimensional diagram of a non-volatile memory device according to an embodiment of the present invention.

Please refer to FIG. 9A, FIG. 9B and FIG. 9C. FIG. 9A and FIG. 9B respectively show a cross-sectional diagram and a three-dimensional diagram of a non-volatile memory device according to an embodiment of the present invention, while, FIG. 9C shows an operation table corresponding to an operation of FIG. 9A and FIG. 9B. As shown in FIG. 9A and FIG. 9B, a non-volatile memory device 90 according to the present invention is formed on a semiconductor substrate 91. The non-volatile memory device 90 includes: an insulation layer 92, writing wires 942 and 971, PN diodes 931 and 932, a memory unit 95, a selection wire 96 and connection conduction units 94 and 972. This embodiment can be applied in, for example but not limited to, a STT-MRAM device or a bi-directional RRAM device.

The insulation layer 92 is formed on the semiconductor substrate 91, wherein the insulation layer 92 is electrically insulative. The writing wire 942 and the writing wire 971 are conductive. The writing wire 942 is electrically connected to the anode end 931*a* (i.e., P-conductivity type end in this embodiment) of the PN diode 931, whereas, the writing wire 971 is electrically connected to the cathode end 932*a* (i.e., N-conductivity type end in this embodiment) of the PN diode 932. The PN diode 931 and the PN diode 932 are formed in a monocrystalline silicon layer, a monocrystalline germanium layer or a monocrystalline gallium arsenide layer on a first conductive layer 940 on the insulation layer 92. The memory unit 95 is located above the PN diodes 931 and 932. The memory unit 95 is electrically connected to the cathode end 931*b* (i.e., N-conductivity type end in this embodiment) of the PN diode 931 and the anode end 932*b* (i.e., P-conductivity type end in this embodiment) of the PN diode 932. The selection wire 96 is located on the memory unit 95 and is electrically connected to the memory unit 95. In a case where the non-volatile memory device 90 is selected for a data to be written into, a first current I0 flows through the PN diode 931, so as to write the data into the memory unit 95. In a case where the non-volatile memory device 90 is selected for another data to be written into, a second current I1 flows through the PN diode 932, so as to write the other data into the memory unit 95. It is noteworthy that, in this embodiment, the flowing direction of the first current I0 through the memory unit 95 is opposite to the flowing direction of the second current I1 through the memory unit 95.

In this embodiment, the connection conduction unit 972 is configured to electrically connect the memory unit 95 to the cathode end 931b (i.e., N-conductivity type end in this embodiment) of the PN diode 931. A portion of the connection conduction unit 972 is stacked and connected on the cathode end 931b of the PN diode 931. The connection conduction unit 94 is configured to electrically connect the connection conduction unit 972 to the anode end 932b of the PN diode 932, so as to electrically connect the memory unit 95 to the anode end 932b. The first writing wire 942 is stacked and connected on the insulation layer 92; the anode end 931a is stacked and connected on the first writing wire 942; the cathode end 931b is stacked and connected on the anode end 931a. A first portion 941 of the connection conduction unit 94 is stacked and connected on the insulation layer 92; a second portion 921 of the connection conduction unit 94 is stacked and connected on the first portion 941; another portion of the connection conduction unit 972 is stacked and connected on the second portion 921. The anode end 932b of the PN diode 932 is stacked and connected on the first portion 941; the cathode end 932a of the PN diode 932 is stacked and connected on the anode end 932b; the writing wire 971 is stacked and connected on the cathode end 932a.

The writing wires 942 and a first portion 941 of the connection conduction unit 94 are formed by one same metal line formation process. The anode end 931a and the anode end 932b are formed by one same ion implantation process or by one same epitaxial process. The cathode end 931b and the cathode end 932a are formed by one same ion implantation process or by one same epitaxial process. For example, the writing wires 942 and the first portion of the connection conduction unit 941 are formed in the first conductive layer 940, which is located on and connected to the insulation layer 92.

As one of average skill in the art readily understands, "one same metal line formation process", refers to a process which first forms a metal layer by a metal deposition process, and next by one same lithography process wherein one same mask is adopted, a layout of metal lines in the metal layer is defined; and next the metal lines are formed by one same etching process. Besides, as one of average skill in the art readily understands, "one same ion implantation process", refers to an impurities doping process where a single type or plural types of impurities of a same species are implanted into a same depth of a semiconductor layer in the form of accelerated ions by a same accelerating voltage. Moreover, as one of average skill in the art readily understands, "same epitaxial process", refers to a process wherein new crystal is grown on an existing monocrystalline silicon layer, so as to create a new semiconductor layer. Such process is also named as "epitaxial growth process". The above-mentioned three processes are well known to those skilled in the art, so the details thereof are not redundantly explained here.

In one embodiment as an example, as shown by the operation table in FIG. 9C, when an addressing operation selects the non-volatile memory device 90 to write a data indicative of "0" (or "1" depending on the definition of the bit) into the memory unit 95, the writing wire 942 is electrically connected to a writing voltage Vw and the selection wire 96 is electrically connected to a ground level, so as to generate the first current I0. As a result, the thus generated first current I0 flows from the writing wire 942, through the PN diode 931 (where the P-conductivity type region is at a lower position whereas the N-conductivity type region is at an upper position), the connection conduction unit 972 and the memory unit 95, to the selection wire 96. By this current, the non-volatile memory device 90 can write a data indicative of "0" into the memory unit 95 through changing a crystallization status of a material of a phase change area, a magnetization orientation of a magnetic area or a resistance of a resistance change area in the memory unit 95. In regard to the writing wire 971, under such situation, the writing wire 971 is electrically floating. With respect to unselected non-volatile memory devices 90, the writing wires 942 and 971 and the selection wire 96 of the unselected non-volatile memory devices 90 for example can also be electrically floating.

On the other hand, for another example, as shown by the operation table in FIG. 9C, when an addressing operation selects the non-volatile memory device 90 to write a data indicative of "1" (or "0" depending on the definition of the bit) into the memory unit 95, the selection wire 96 is electrically connected to the writing voltage Vw and the writing wire 971 is electrically connected to the ground level, so as to generate the second current I1. As a result, the thus generated second current I1 flows from the selection wire 96, through the memory unit 95, a second portion 921 and a first portion 941 of the connection conduction unit 94, the PN diode 932 (where the P-conductivity type region is at a lower position whereas the N-conductivity type region is at an upper position), to the writing wire 971. By this current, the non-volatile memory device 90 can write a data indicative of "1" into the memory unit 95 through changing a crystallization status of a material of a phase change area, a magnetization orientation of a magnetic area or a resistance of a resistance change area in the memory unit 95. In regard to the writing wire 942, under such situation, the writing wire 942 is electrically floating. With respect to unselected non-volatile memory devices 90, the writing wires 942 and 971 and the selection wire 96 of the unselected non-volatile memory devices 90 for example can also be electrically floating.

In one embodiment, the non-volatile memory device 90 can read data stored in the memory unit 95 by electrically connecting the selection wire 96 to a reading voltage Vr, and determining that the data stored in the memory unit 95 is "0" or "1" according to a voltage of the writing wire 971.

In regard to the details as to how a monocrystalline silicon layer is formed on a metal layer, please refer to US Patent Publication No. 2010/0044670A1. However, this prior art describes that it can be applied in a PCRAM device and an MRAM device, which is incorrect. An MRAM device requires two currents of different current flow directions, so this prior art having one single PN diode cannot achieve an MRAM device.

FIG. 9D shows a schematic diagram of a non-volatile memory circuit according to an embodiment of the present invention. As shown in FIG. 9D and also referring to FIGS. 9A-9B, the non-volatile memory circuit 9 includes: a non-volatile memory device array 900 including plural non-volatile memory devices 90; and a control circuit 910 controlling the non-volatile memory device array 900 so as to read from or write into the non-volatile memory devices 90; wherein the non-volatile memory device 90, as shown by FIGS. 9A-9B, includes: an insulation layer 92, which is electrically insulative; PN diodes 931 and 932, which are formed in a monocrystalline silicon layer, a monocrystalline germanium layer or a monocrystalline gallium arsenide layer on the insulation layer 92; writing wires 942 and 971 which are conductive, wherein the writing wires 942 and 971 are respectively electrically connected to an anode end 931*a* of the PN diode 931, and a cathode end 932*a* of the PN diode 932; a memory unit 95, which is located on the PN diodes 931 and 932, wherein the memory unit 95 is electrically connected to a cathode end 931*b* of the PN diode 931 and an anode end 932*b* of the PN diode 932; and a selection wire 96 which is conductive, wherein the selection wire 96 is located on the memory unit 95 and is electrically connected to the memory unit 95; wherein in a case where the non-volatile memory device 90 is selected for a data to be written into, a first current I0 flows through the PN diode 931, so as to write the data into the memory unit 95, and in a case where the non-volatile memory device 90 is selected for another data to be written into, a second current I1 flows through the PN diode 932, so as to write the other data into the memory unit 95. The flowing direction of the first current I0 is opposite to the flowing direction of the second current I1.

Please refer to FIG. 10, which shows a three-dimensional diagram of a non-volatile memory device according to an embodiment of the present invention. This embodiment demonstrates how plural non-volatile memory devices can be arranged and connected. As shown in FIG. 10, the non-volatile memory devices 90 and 90' for example can share one writing wire 942 and one writing wire 971.

Figure 11A:
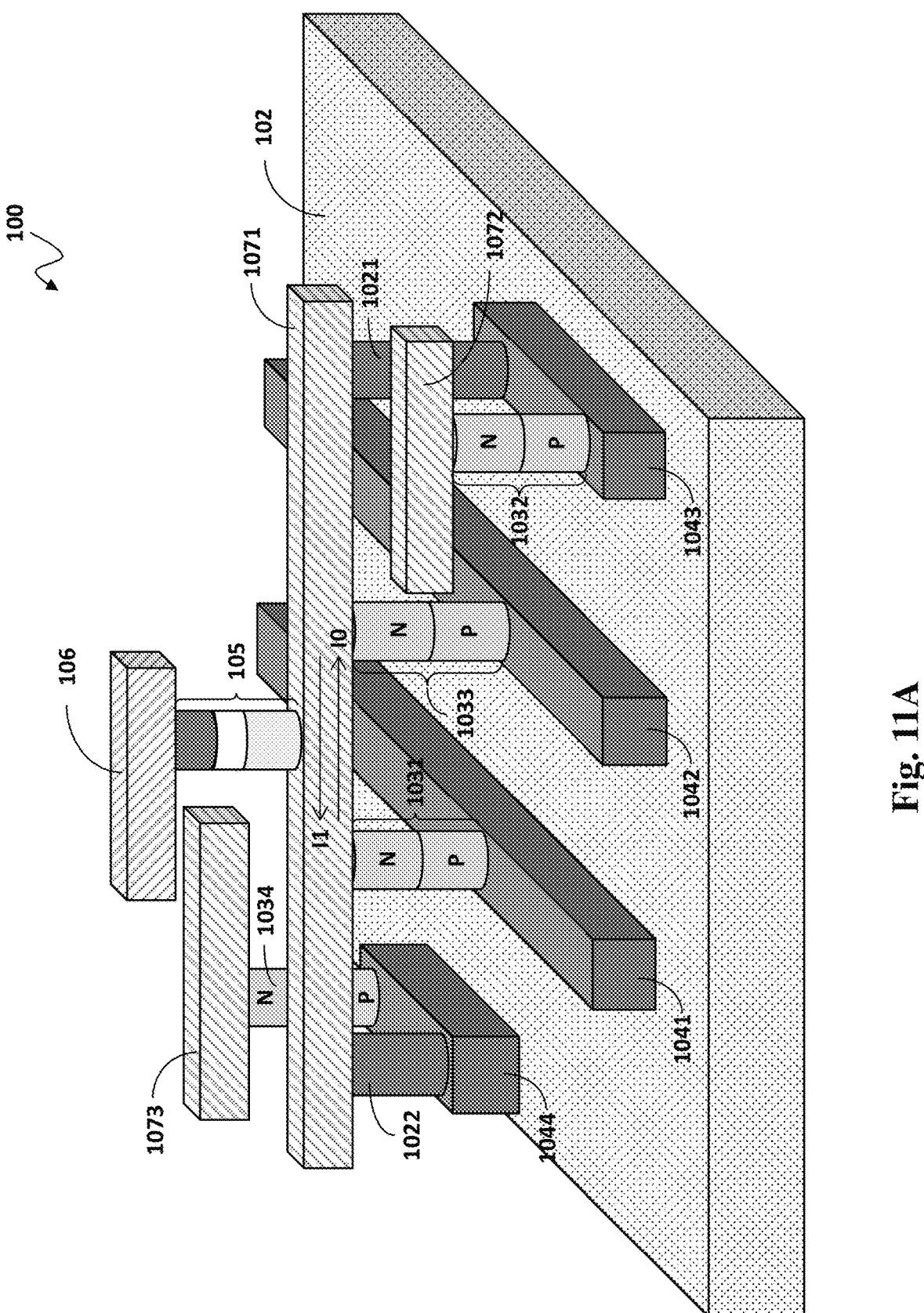

Please refer to FIG. 11A and FIG. 11B. FIG. 11A shows a three-dimensional diagram of a non-volatile memory device according to an embodiment of the present invention, while, FIG. 11B shows an operation table corresponding to an operation of FIG. 11A. As shown in FIG. 11A, a non-volatile memory device 100 according to the present invention is a five end device and is formed on a semiconductor substrate (not shown; please refer to other embodiments, such as the semiconductor substrate 91 shown in FIG. 9A). The non-volatile memory device 100 includes: an insulation layer 102, writing wires 1041, 1042, 1072 and 1073, PN diodes 1031, 1032, 1033 and 1034, conductive plugs 1021 and 1022, a memory unit 105, a selection wire 106 and connection conduction units 1071, 1043 and 1044. The five ends of non-volatile memory device 100 are the writing wires 1041 and 1042 and the selection wire 106.

The insulation layer 102 is formed on the semiconductor substrate (not shown), wherein the insulation layer 102 is electrically insulative. The writing wires 1041, 1042, 1072 and 1073 are conductive. The PN diodes 1031, 1032, 1033 and 1034 have a characteristic of one-way conduction, which can be, for example but not limited to, PN diodes shown in FIG. 11A. The memory unit 105 is located above the PN diodes 1031, 1032, 1033 and 1034 and the connection conduction unit 1071. The selection wire 106 is located on the memory unit 105 and is electrically connected to the memory unit 105. In a case where the non-volatile memory device 100 is selected for a data to be written into, a first current I0 flows through the PN diodes 1031 and 1032, so as to write the data into the memory unit 105. In a case where the non-volatile memory device 100 is selected for another data to be written into, a second current I1 flows through the PN diodes 1033 and 1034, so as to write the other data into the memory unit 105. This embodiment can be applied, for example but not limited to, a spin orbit torque (SOT) type MRAM (SOT-MRAM) device.

In one embodiment as an example, as shown by the operation table in FIG. 11B, when an addressing operation selects the non-volatile memory device 100 to write a data indicative of "0" (or "1" depending on the definition of the bit) into the memory unit 105, the writing wire 1041 is electrically connected to a writing voltage Vw and the writing wire 1072 is electrically connected to a ground level, so as to generate the first current I0. As a result, the thus generated first current I0 flows from the writing wire 1041, through the PN diode 1031 (where the P-conductivity type region is at a lower position whereas the N-conductivity type region is at an upper position), the connection conduction unit 1071, the conductive plug 1021, the connection conduction unit 1043, and the PN diode 1032 (where the P-conductivity type region is at a lower position whereas the N-conductivity type region is at an upper position), to the writing wire 1072. Because the first current I0 flows through the connection conduction unit 1071 electrically connected to the electrode of the memory unit 105, a magnetization orientation of a magnetic area in the memory unit 105 is changed, whereby a data indicative of "0" is written into the memory unit 105. In regard to the writing wires 1042 and 1073 and the selection wire 106, under such situation, the writing wires 1042 and 1073 and the selection wire 106 are electrically floating. With respect to unselected non-volatile memory devices 100, the writing wires 1041, 1042, 1072 and 1073 and the selection wire 106 of the unselected non-volatile memory devices 100 for example can also be electrically floating.

On the other hand, for another example, as shown by the operation table in FIG. 11B, when an addressing operation selects the non-volatile memory device 100, to write a data indicative of "1" (or "0" depending on the definition of the bit) into the memory unit 105, the writing wire 1042 is electrically connected to the writing voltage Vw and the writing wire 1073 is electrically connected to the ground level, so as to generate the second current I1. As a result, the thus generated second current I1 flows from the writing wire 1042, through the PN diode 1033 (where the P-conductivity type region is at a lower position whereas the N-conductivity type region is at an upper position), through the connection conduction unit 1071, the conductive plug 1022, the connection conduction unit 1044, and the PN diode 1034 (where the P-conductivity type region is at a lower position whereas the N-conductivity type region is at an upper position), to the writing wire 1073. Because the second current I1 flows through the connection conduction unit 1071 electrically connected to the electrode of the memory unit 105 a magnetization orientation of a magnetic area in the memory unit 105 is changed, but the direction along which the second current I1 flows through the memory unit 105 is opposite to the direction along which the first current I0 flows through the memory unit 105 to write a data indicative of "0", so a data indicative of "1" is written into the memory unit 105. In regard to the writing wires 1041 and 1072 and the selection wire 106, under such situation, the writing wires 1041 and 1072 and the selection wire 106 are electrically floating. With respect to unselected non-volatile memory devices 100, the writing wires 1041, 1042, 1072 and 1073 and the selection wire 106 of the unselected non-volatile memory devices 100 for example can also be electrically floating.

In one embodiment, the non-volatile memory device 100 can read data stored in the memory unit 105 by electrically connecting the selection wire 106 to a reading voltage Vr, and determining that the data stored in the memory unit 105 is "0" or "1" according to a voltage of the writing wire 1042.

Figure 11C:
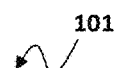
FIG. 11C shows a schematic diagram of a non-volatile memory circuit according to an embodiment of the present invention.

FIG. 11C shows a schematic diagram of a non-volatile memory circuit according to an embodiment of the present invention. As shown in FIG. 11C and also referring to FIG. 11A, the non-volatile memory circuit 101 includes: a non-volatile memory device array 1000 including plural non-volatile memory devices 100; and a control circuit 1100 controlling the non-volatile memory device array 1000 so as to read from or write into the non-volatile memory devices 100; wherein the non-volatile memory device 100, as shown by FIG. 11A, includes: an insulation layer 102, which is electrically insulative; PN diodes 1031, 1032, 1033 and 1034, which are formed in a monocrystalline silicon layer, a monocrystalline germanium layer or a monocrystalline gallium arsenide layer on the insulation layer 102; writing wires 1041, 1042, 1072 and 1073 which are conductive, wherein the writing wires 1041, 1042, 1072 and 1073 are respectively electrically connected to an anode end of the PN diode 1031, an anode end of the PN diode 1033, a cathode end of the PN diode 1032, and a cathode end of the PN diode 1034; a memory unit 105, which is located on the PN diodes 1031, 1032, 1033 and 1034, wherein the memory unit 105 is electrically connected to the cathode ends of the PN diodes 1031 and 1033; and a selection wire 106 which is conductive, wherein the selection wire 106 is located on the memory unit 105 and is electrically connected to the memory unit 105; wherein in a case where the non-volatile memory device 100 is selected for a data to be written into, a first current I0 flows through the PN diodes 1031 and 1032, so as to write the data into the memory unit 105, and in a case where the non-volatile memory device 100 is selected for another data to be written into, a second current I1 flows through the PN diodes 1033 and 1034, so as to write the other data into the memory unit 105. The flowing direction of the first current I0 is opposite to the flowing direction of the second current I1.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, a manufacturing process or a structure which does not substantially influence the primary function of the device can be inserted between any two structures in the shown embodiments. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A non-volatile memory device array, comprising:
an insulation layer, which is electrically insulative;
a plurality of non-volatile memory devices arranged by rows and columns, each of the plurality of non-volatile memory devices comprising:
a first PN diode having a first anode end and a first cathode end, which is formed in a monocrystalline silicon layer, a monocrystalline germanium layer or a monocrystalline gallium arsenide layer on the insulation layer;
a second PN diode having a second anode end and a second cathode end, the second PN diode formed in the monocrystalline silicon layer, monocrystalline germanium layer or monocrystalline gallium arsenide layer on the insulation layer;
a second connection conduction unit comprising a first portion and a second portion, the first portion of the second connection conduction unit stacked and connected on the insulation layer, the second anode end of the second PN diode stacked and connected on the first portion of the second connection conduction unit, the first portion of the second connection conduction unit disposed between the second anode end of the second PN diode and the insulation layer, the second anode end of the second PN diode disposed between the first portion of the second connection conduction unit and the second cathode end of the second PN diode, and the second portion of the second connection conduction unit stacked and connected on the first portion of the second connection conduction unit; and
a memory unit, which is located on the first PN diode, wherein the memory unit is electrically connected to the first cathode end of the first PN diode;
a selection wire which is conductive, wherein the selection wire is located on and is electrically connected to the memory unit of a first non-volatile memory device of the plurality of non-volatile memory devices;
a first writing wire which is conductive, wherein the first writing wire is electrically connected to the first anode end of the first PN diode of the first non-volatile memory device; and
a second writing wire which is conductive, wherein the second writing wire is electrically connected to the second cathode end of the second PN diode of the first non-volatile memory device;
wherein the first writing wire is disposed between the first anode end of the first PN diode of the first non-volatile memory device and the insulation layer, and the first anode end of the first PN diode of the first non-volatile memory device is disposed between the first writing wire and the first cathode end of the first PN diode of the first non-volatile memory device;
wherein in a case where the first non-volatile memory device is selected for a first data to be written into, a first current flows through the first PN diode of the first non-volatile memory device, so as to write the first data into the memory unit of the first non-volatile memory device; and
wherein in a case where the first non-volatile memory device is selected to for a second data to be written into, a second current flows through the second portion of the second connection conduction unit, the first portion of the second connection conduction unit, and the second PN diode of the first non-volatile memory device, so as to write the second data into the memory unit of the first non-volatile memory device.

2. The non-volatile memory device array of claim 1, wherein the first writing wire is stacked and directly connected on the insulation layer, and wherein the first PN diode of the first non-volatile memory device is stacked and directly connected on the first writing wire.

3. The non-volatile memory device array of claim 1, wherein each of the plurality of non-volatile memory devices further comprising:

a first connection conduction unit, which is configured to electrically connect the memory unit to the first cathode end of the first PN diode, wherein a portion of the first connection conduction unit is stacked and connected on the first cathode end of the first PN diode; and wherein the second connection conduction unit is configured to electrically connect the first connection conduction unit to the second anode end of the second PN diode, so that the memory unit is electrically connected to the second anode end of the second PN diode; and wherein the first writing wire is stacked and connected on the insulation layer, and wherein the first anode end of the first PN diode of the first non-volatile memory device is stacked and connected on the first writing wire, and wherein in the first non-volatile memory device, the first cathode end is stacked and connected on the first anode end;

wherein in the first non-volatile memory device, another portion of the first connection conduction unit is stacked and connected on the second portion of the second connection conduction unit;

wherein in the first non-volatile memory device, the second cathode end is stacked and connected on the second anode end, and wherein the second writing wire is stacked and connected on the second cathode end of the first non-volatile memory device;

wherein the first writing wire and the first portion of the second connection conduction unit of the first non-volatile memory device are formed by one same metal line formation process;

wherein the first anode end of the first non-volatile memory device and the second anode end of the first non-volatile memory device are formed by one same ion implantation process or by one same epitaxial process;

wherein the first cathode end of the first non-volatile memory device and the second cathode end of the first non-volatile memory device are formed by one same ion implantation process or by one same epitaxial process.

4. The non-volatile memory device array of claim 1, wherein each of the plurality of non-volatile memory devices further comprising:

a first connection conduction unit, which is electrically connected between the first PN diode and the memory unit, wherein the first connection conduction unit is configured to electrically connect the memory unit to the first cathode end of the first PN diode.

5. The non-volatile memory device array of claim 1, wherein the second connection conduction unit is electrically connected between the second PN diode and the memory unit, wherein the second connection conduction unit is configured to electrically connect the memory unit to the second anode end of the second PN diode.

6. The non-volatile memory device array of claim 1, wherein each of the plurality of non-volatile memory devices is a phase change random access memory (PCRAM)), a magnetoresistive random access memory (MRAM) or a resistive random access memory (RRAM).

7. The non-volatile memory device array of claim 1, wherein the first writing wire is a metal wire.

8. The non-volatile memory device array of claim 1, wherein the first writing wire and the second writing wire are both metal wires.

9. The non-volatile memory device array of claim 1, wherein each of the plurality of non-volatile memory devices is formed on a semiconductor-on-insulator (SOI) substrate or a semiconductor-metal-on-insulator (SMOI) substrate.

10. The non-volatile memory device array of claim 3, wherein the first connection conduction unit of the first non-volatile memory device and the second writing wire are formed by one same metal line formation process.

11. A non-volatile memory circuit, comprising:

a non-volatile memory device array including a plurality of non-volatile memory devices arranged by rows and columns, a first writing wire, a second writing wire which is conductive, and a selection wire; and a control circuit configured to operably control the non-volatile memory device array so as to read from or write into the non-volatile memory devices;

an insulation layer, which is electrically insulative;

wherein each of the plurality of non-volatile memory devices includes:

a first PN diode having a first anode end and a first cathode end, which is formed in a monocrystalline silicon layer, a monocrystalline germanium layer or a monocrystalline gallium arsenide layer on the insulation layer;

a second PN diode having a second anode end and a second cathode end, the second PN diode formed in the monocrystalline silicon layer, monocrystalline germanium layer or monocrystalline gallium arsenide layer on the insulation layer;

a second connection conduction unit comprising a first portion and a second portion, the first portion of the second connection conduction unit stacked and connected on the insulation layer, the second anode end of the second PN diode stacked and connected on the first portion of the second connection conduction unit, the first portion of the second connection conduction unit disposed between the second anode end of the second PN diode and the insulation layer, the second anode end of the second PN diode disposed between the first portion of the second connection conduction unit and the second cathode end of the second PN diode, and the second portion of the second connection conduction unit stacked and connected on the first portion of the second connection conduction unit; and a memory unit, which is located on the first PN diode, wherein the memory unit is electrically connected to the first cathode end of the first PN diode;

wherein the first writing wire is conductive, and the first writing wires is electrically connected to the first anode end of the first PN diode of a first non-volatile memory device;

wherein the second writing wire is electrically connected to the second cathode end of the second PN diode of the first non-volatile memory device;

wherein the selection wire is conductive, wherein the selection wire is located on and is electrically connected to the memory unit of the first non-volatile memory device;

wherein the first writing wire is disposed between the first anode end of the first PN diode of the first non-volatile memory device and the insulation layer, and the first anode end of the first PN diode of the first non-volatile memory device is disposed between the first writing wire and the first cathode end of the first PN diode of the first non-volatile memory device; and wherein in a case where the first non-volatile memory device is selected for a first data to be written into, a first current flows through the first PN diode of the first non-volatile memory device, so as to write the first data into the memory unit of the first non-volatile memory device; and wherein in a case where the first non-volatile memory device is selected to for a second data to be written into, a second current flows through the second portion of the second connection conduction unit, the first portion of the second connection conduction unit, and the second PN diode of the first non-volatile memory device, so as to write the second data into the memory unit of the first non-volatile memory device.

12. The non-volatile memory circuit of claim 11, wherein the first writing wire is stacked and directly connected on the insulation layer, and wherein the first PN diode of the first non-volatile memory device is stacked and directly connected on the first writing wire.

13. The non-volatile memory circuit of claim 11, wherein each of the plurality of non-volatile memory devices further comprises:

a first connection conduction unit, which is configured to electrically connect the memory unit to the first cathode end of the first PN diode, wherein a portion of the first connection conduction unit is stacked and connected on the first cathode end of the first PN diode; and wherein the second connection conduction unit is configured to electrically connect the first connection conduction unit to the second anode end of the second PN diode, so that the memory unit is electrically connected to the second anode end of the second PN diode; and wherein the first writing wire is stacked and connected on the insulation layer, and wherein the first anode end of the first PN diode of the first non-volatile memory device is stacked and connected on the first writing wire, and wherein the first cathode end is stacked and connected on the first anode end of the first non-volatile memory device;

wherein in the first non-volatile memory device, another portion of the first connection conduction unit is stacked and connected on the second portion of the second connection conduction unit;

wherein in the first non-volatile memory device, the second cathode end is stacked and connected on the second anode end, and wherein the second writing wire is stacked and connected on the second cathode end of the first non-volatile memory device;

wherein the first writing wire and the first portion of the second connection conduction unit of the first non-volatile memory device are formed by one same metal line formation process;

wherein the first anode end of the first non-volatile memory device and the second anode end of the first non-volatile memory device are formed by one same ion implantation process or by one same epitaxial process;

wherein the first cathode end of the first non-volatile memory device and the second cathode end of the first non-volatile memory device are formed by one same ion implantation process or by one same epitaxial process.

14. The non-volatile memory circuit of claim 11, wherein each of the plurality of non-volatile memory devices further comprises:

a first connection conduction unit, which is electrically connected between the first PN diode and the memory unit, wherein the first connection conduction unit is configured to electrically connect the memory unit to the first cathode end of the first PN diode.

15. The non-volatile memory circuit of claim 11, wherein the second connection conduction unit is electrically connected between the second PN diode and the memory unit, wherein the second connection conduction unit is configured to electrically connect the memory unit to the second anode end of the second PN diode.

16. The non-volatile memory circuit of claim 11, wherein each of the plurality of non-volatile memory devices is a phase change random access memory (PCRAM)), a magnetoresistive random access memory (MRAM) or a resistive random access memory (RRAM).

17. The non-volatile memory device array of claim 1, wherein the first writing wire and the first portion of the connection conduction unit of the first non-volatile memory device are formed by one same metal line formation process;

wherein the first anode end of the first non-volatile memory device and the second anode end of the first non-volatile memory device are formed by one same ion implantation process or by one same epitaxial process; and wherein the first cathode end of the first non-volatile memory device and the second cathode end of the first non-volatile memory device are formed by one same ion implantation process or by one same epitaxial process.

18. A non-volatile memory device array comprising:

an insulation layer, which is electrically insulative;

a plurality of non-volatile memory devices arranged by rows and columns, each of the plurality of non-volatile memory devices comprising:

a first PN diode having a first anode end and a first cathode end, which is formed in a monocrystalline silicon layer, a monocrystalline germanium layer or a monocrystalline gallium arsenide layer on the insulation layer;

a second PN diode having a second anode end and a second cathode end, the second PN diode formed in the monocrystalline silicon layer, monocrystalline germanium layer or monocrystalline gallium arsenide layer on the insulation layer;

a third PN diode having a third anode end and a third cathode end;

a fourth PN diode having a fourth anode end and a fourth cathode end; and a memory unit, which is located on the first PN diode, wherein the memory unit is electrically connected to the first cathode end of the first PN diode;

a selection wire which is conductive, wherein the selection wire is located on and is electrically connected to the memory unit of a first non-volatile memory device of the plurality of non-volatile memory devices; and a first writing wire which is conductive, wherein the first writing wire is electrically connected to the first anode end of the first PN diode of the first non-volatile memory device; and a second writing wire which is conductive, wherein the second writing wire is electrically connected to the second anode end of the second PN diode of the first non-volatile memory device;

wherein the first writing wire is disposed between the insulation layer and the first PN diode of the first non-volatile memory device, and the first anode end of the first PN diode is disposed between the first writing wire and the first cathode end of the first PN diode;

wherein the second writing wire is disposed between the insulation layer and the second PN diode of the first non-volatile memory device, and the second anode end of the second PN diode is disposed between the second writing wire and the second cathode end of the second PN diode;

wherein in a case where the first non-volatile memory device is selected for a first data to be written into, a first current flows through the first PN diode and the third PN diode of the first non-volatile memory device, so as to write the first data into the memory unit of the first non-volatile memory device;

wherein in a case where the first non-volatile memory device is selected to for a second data to be written into, a second current flows through the second PN diode and the fourth PN diode of the first non-volatile memory device, so as to write the second data into the memory unit of the first non-volatile memory device.

19. The non-volatile memory device array of claim 18, wherein the first writing wire and the second writing wire are formed by one same metal line formation process;

wherein the first anode end, the second anode end, the third anode end, and the fourth anode end of the first non-volatile memory device are formed by one same ion implantation process or by one same epitaxial process; and wherein the first cathode end, the second cathode end, the third cathode end, and the fourth cathode end of the first non-volatile memory device are formed by one same ion implantation process or by one same epitaxial process.

* * * * *